United States Patent

Bolger et al.

Patent Number: 5,565,930
Date of Patent: Oct. 15, 1996

[54] RECEIVER WITH OVERSAMPLING ANALOG-TO-DIGITAL CONVERSION FOR DIGITAL SIGNALS ACCOMPANIED BY ANALOG TV SIGNALS

[75] Inventors: Thomas V. Bolger, Merchantville, N.J.; Jiang Yang, Mansfield, Mass.; Allen L. Limberg, Vienna, Va.

[73] Assignee: Samsung Electronics Co., Ltd., Kyungki-do, Rep. of Korea

[21] Appl. No.: 474,165

[22] Filed: Jun. 7, 1995

Related U.S. Application Data

[63] Continuation of Ser. No. 141,071, Oct. 26, 1993, abandoned, and Ser. No. 179,586, Jan. 5, 1994, abandoned.

[51] Int. Cl.⁶ ............................. H04N 7/08; H04N 5/44
[52] U.S. Cl. .................. 348/572; 348/725; 348/475; 375/247; 375/324; 375/329
[58] Field of Search .................... 348/470, 608, 348/475, 533, 609, 572, 725; 329/304, 356, 357; 375/282, 296, 324, 329, 332, 247, 279, 325; H04N 7/08, 5/44

[56] References Cited

U.S. PATENT DOCUMENTS

| | | | |
|---|---|---|---|
| 4,612,518 | 9/1986 | Gans et al. | 375/332 |
| 4,851,841 | 7/1989 | Sooch | 375/247 |
| 5,093,723 | 3/1992 | Yang | 348/475 |
| 5,229,847 | 7/1993 | Gibson | 348/475 |
| 5,376,894 | 12/1994 | Petranovich | 375/329 |

*Primary Examiner*—John K. Peng
*Assistant Examiner*—Jeffrey S. Murrell
*Attorney, Agent, or Firm*—Sughrue, Mion, Zinn, Macpeak & Seas

[57] ABSTRACT

Digital signal receivers for detecting BPSK modulation of a suppressed carrier transmitted through the same channel as an analog television signal are described, in which the detected BPSK is digitized with an oversampling analog-to-digital converter prior to digital comb filtering for separating the BPSK from interfering analog television signal remnants. This is done to get an increased number of bits resolution from a relatively inexpensive flash converter so that the BPSK, which is of relatively low amplitude compared to maximally interfering analog television signal remnants, is not overwhelmed by quantizing noise. The oversampling analog-to-digital converter can be of sigma-delta type.

108 Claims, 17 Drawing Sheets

500

RECEIVER WITH OVERSAMPLING ANALOG-TO-DIGITAL CONVERSION FOR DIGITAL SIGNALS ACCOMPANIED BY ANALOG TV SIGNALS

This is a Combined Continuation of U.S. patent application Ser. No. 08/141,071 filed Oct. 26, 1993, now abandoned and of U.S. patent application Ser. No. 08/179,586 filed Jan. 5, 1994, now abandoned.

The invention relates to receivers for recovering digital signals buried in analog television signals.

BACKGROUND OF THE INVENTION

Relatively small (e.g., 3 to 5 IRE) signals encoding digital information can be admixed together with composite video signals without being readily evident in television pictures generated from those composite video signals if suitable restrictions on the digital signal format are observed. Jian Yang describes a system for doing this in his U.S. patent application Ser. No. 08/141,070 filed Nov. 26, 1993, entitled "APPARATUS FOR PROCESSING NTSC TV SIGNALS HAVING DIGITAL SIGNALS ON QUADRATURE-PHASE VIDEO CARRIER", and incorporated by reference herein. The inventions described in U.S. patent application Ser. No. 08/141,070, like the inventions described herein, are assigned to Samsung Electronics Co., Ltd., pursuant to pre-existing employee agreement so to assign inventions made within the scope of employment. U.S. patent application Ser. No. 08/141,070 describes binary phase-shift-keyed (BPSK) modulation of a suppressed carrier that is the same frequency as a video carrier and is in quadrature phasing therewith. U.S. patent application Ser. No. 08/141,070 advocates the BPSK signals being constrained to about 2 MHz bandwidth so as to avoid crosstalk into chroma in TV receivers that separate chroma from luma without recourse to comb filtering. U.S. patent application Ser. No. 08/141,070 indicates a preference for passing the data to be transmitted through a partial-response filter for processing the data so that it can be recovered by multi-level symbol decision circuitry after line-comb filtering in the digital signal receiver to separate PSK subcarrier from the luminance portion of the composite video signal. U.S. patent application Ser. No. 08/141,070 also advocates repeating frames of the BPSK in antiphase in successive pairs of consecutive frames of the NTSC television signal. Such repetition of data in pairs of frames makes the BPSK accompanying the composite video signal detected from the NTSC television signal less apparent in images that are generated from the composite video signal for viewing on a screen. Such repetition of data in pairs of frames also provides a basis for using frame-comb filtering in the digital signal receiver to separate the BPSK from the luminance portion of the composite video signal that describes static portions of successive television images.

U.S. patent application Ser. No. 08/141,070 describes the problems encountered in the digital signal receiver when the BPSK is to be digitized after its detection, assuming that the flash converter normally used for digitizing composite video signals is used. The remnants of composite video signal above 750 kHz, which accompany the BPSK when the BPSK is synchronously detected, can be expected to be relatively large compared to the BPSK at times. These large composite video signal remnants take up much of the dynamic range the flash converter provides for analog input signal, if digitization is done just after synchronous detection of the BPSK, and the relatively small BPSK signal tends to be inadequately resolved owing to the quantizing noise of a flash converter that has only eight bits resolution or so. While flash converters that have as many as twelve bits can be constructed, they are too expensive to be used in electronic products for the mass market. U.S. patent application Ser. No. 08/141,070 advocates the use of analog line-comb filtering of the BPSK signals before their digitization, in order to reduce the relative size of the remnants of composite video signal above 750 kHz that accompany the BPSK. The BPSK signal can then be resolved in more of the digital output range of the flash converter to reduce symbol error.

While flash converters increase in price very rapidly with increase in their bit resolution, the increase in price is relatively modest for increased bandwidth beyond the 2 MHz constraint on BPSK bandwidth suggested in U.S. patent application Ser. No. 08/141,070. The 2 MHz constraint on BPSK bandwidth requires 4 MHz sampling rate in order that maximum symbol rate be adequately sampled, and 8-bit flash converters operable at sixteen, thirty-two or even sixty-four times this sample rate are relatively modest in price. It is pointed out in U.S. patent application Ser. No. 08/141,071 that oversampling conversion methods can be used to secure increased effective bit resolution from such 8-bit flash converters. Oversampling at sixteen times the 4 MHz sample rate can secure as much as twelve bits effective resolution, to digitize the detected BPSK without its being lost in the quantizing noise, even though the detected BPSK is relatively small compared to the accompanying composite video signal which occupies most of the dynamic range of the flash converter.

A type of oversampling converter known as a "sigma-delta" analog-to-digital converter is familiar to circuit designers for obtaining multiple-bit resolution from a basic single-bit-resolution ADC. Sigma-delta analog-to-digital converters for increasing the bit resolution of a basic multiple-bit-resolution analog-to-digital converter, though not commonplace, are known. In their operation, sigma-delta analog-to-digital converters feed back digital output signal to a digital-to-analog converter and thence to an analog subtractor, for generating an error signal to be digitized by the basic ADC in subsequent steps of the oversampling procedure. While the quantization noise arising during analog-to-digital conversion is suppressed by the degenerative feedback, being shifted upward in frequency so it can be suppressed by lowpass digital filtering, the quantization noise arising during digital-to-analog conversion is not. For this reason, single-bit coders, which avoid the problem of DAC error, have been preferred in sigma-delta analog-to-digital converters. ADCs using single-bit coders are not suitable for the digital signal receivers receiving BPSK at over 1 megabit/second rate, because the oversampling that must be done in order to meet bit-resolution requirements requires sampling rates too high to be practical. The problems encountered when attempting to use commonly known sigma-delta ADCs using multiple-bit coders led Bolger to pursue oversampling methods other than those using sigma-delta modulation, as described in his U.S. patent application Ser. No. 08/141,071.

T. C. Leslie and B. Singh of Plessey Research Caswell Ltd. in their paper "An Improved Sigma-Delta Modulator Architecture", 1990 IEEE SYMPOSIUM ON CIRCUITS & SYSTEMS, 90 CH 2868-8900000-0372, pp. 372–375, incorporated herein by reference, describe increasing the bit resolution of a basic multiple-bit-resolution ADC by using a sigma-delta procedure in which only a single bit of the basic multiple-bit-resolution ADC output signal is converted back to analog signal for feedback purposes during each oversampling step. The inventors have discerned that the Leslie and Singh type of sigma-delta architecture is well-suited to solving the problems of analog-to-digital conversion encountered after detecting relatively low-power BPSK buried in NTSC television signals.

SUMMARY OF THE INVENTION

The invention is embodied in digital signal receivers for detecting BPSK modulation of a suppressed carrier transmitted through the same channel as an analog television signal, in which the detected BPSK is digitized prior to comb filtering for separating the BPSK from interfering analog television signal remnants. Preferably, digitization of the detected BPSK is done with an oversampling analog-to-digital converter. This provides an increased number of bits resolution from a relatively inexpensive flash converter so that the BPSK, which is of relatively low amplitude compared to maximally interfering analog television signal remnants, is not overwhelmed by quantizing noise. The oversampling analog-to-digital converter is a sigma-delta type of converter in certain preferred embodiments of the invention.

Each of FIGS. 5–8 is a schematic diagram of a respective digital-signal receiver for receiving a television signal with a digital signal buried therewithin and extracting the buried digital signal, each of which digital-signal receivers utilizes an oversampling analog-to-digital converter in accordance with aspects of the invention.

Each of FIGS. 9–12 is a schematic diagram of a respective digital-signal receiver for receiving a television signal with a digital signal buried therewithin and extracting the buried digital signal, each of which digital-signal receivers utilizes an oversampling analog-to-digital converter of sigma-delta type in accordance with further aspects of the invention.

Figure 1:
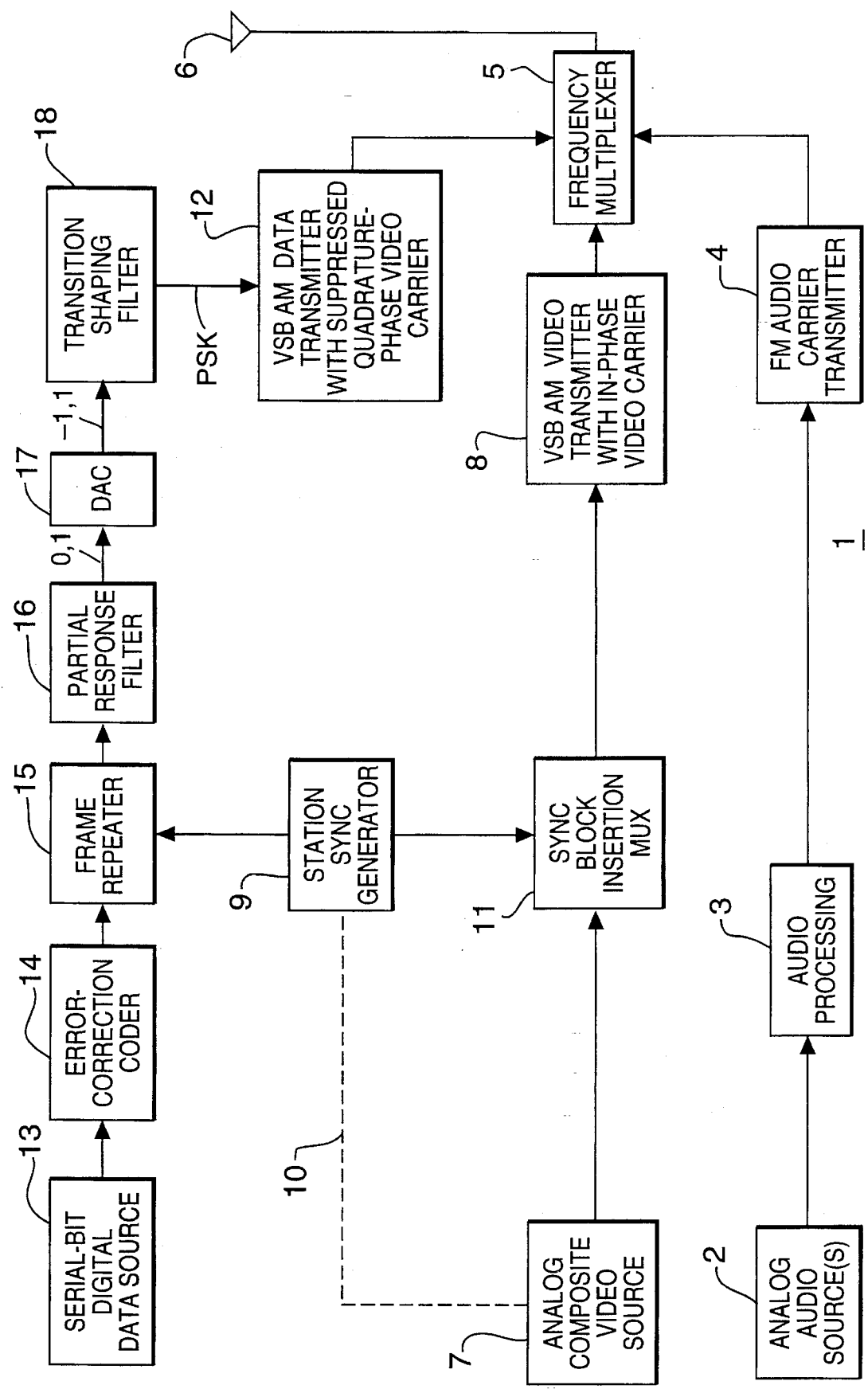
FIG. 1 is an overall schematic diagram of a television transmitter for transmitting a television signal with a digital signal buried therewithin, as described in U.S. patent application Ser. No. 08/141,070.
Figure 4:
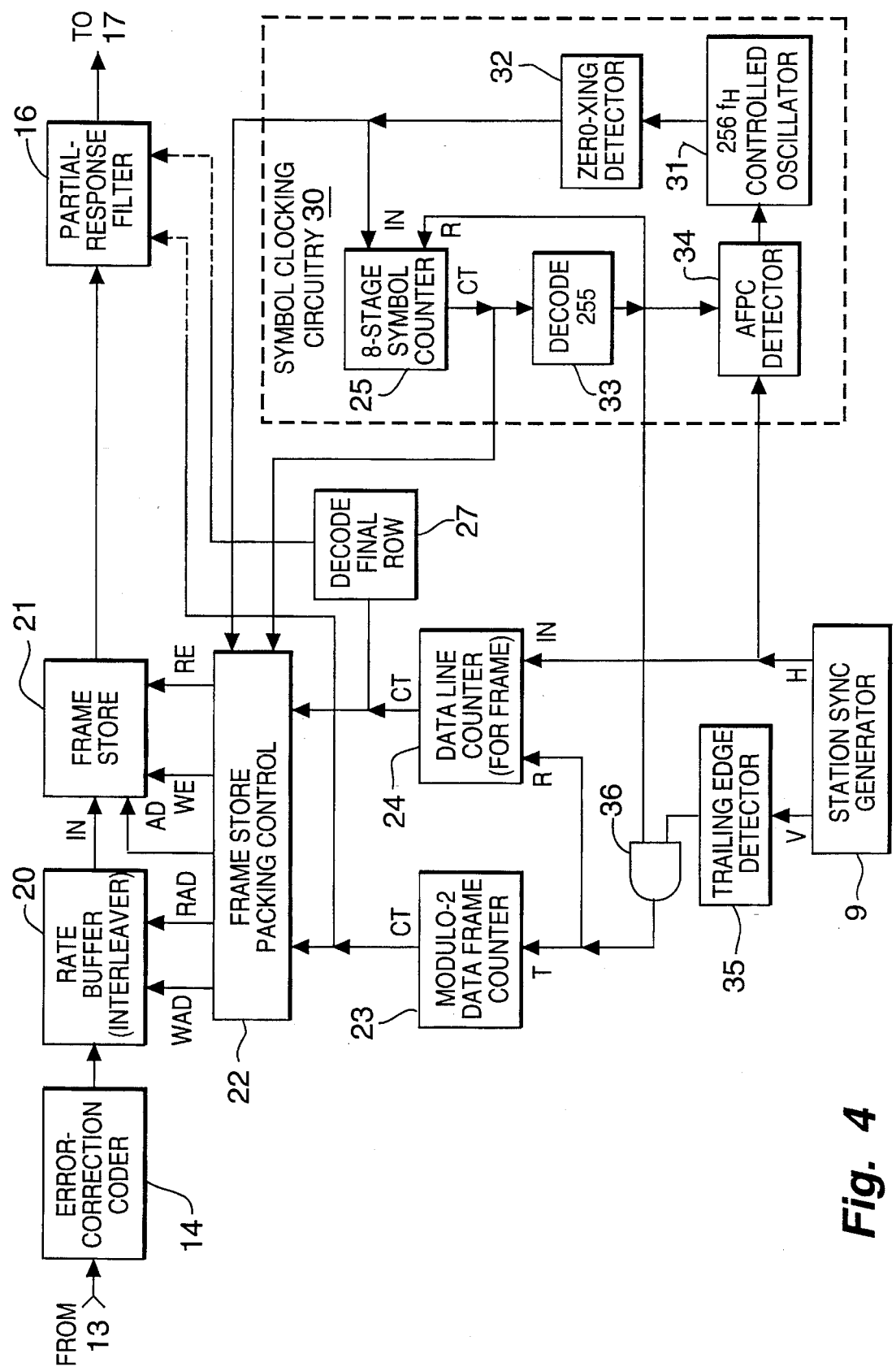
FIG. 4 is a schematic diagram showing in detail a portion of the FIG. 1 television transmitter used for digitally filtering the digital data from which the phase-shift keying signal is to be generated, which phase-shift keying signal modulates the suppressed, quadrature-phase video carrier.
Figure 13:
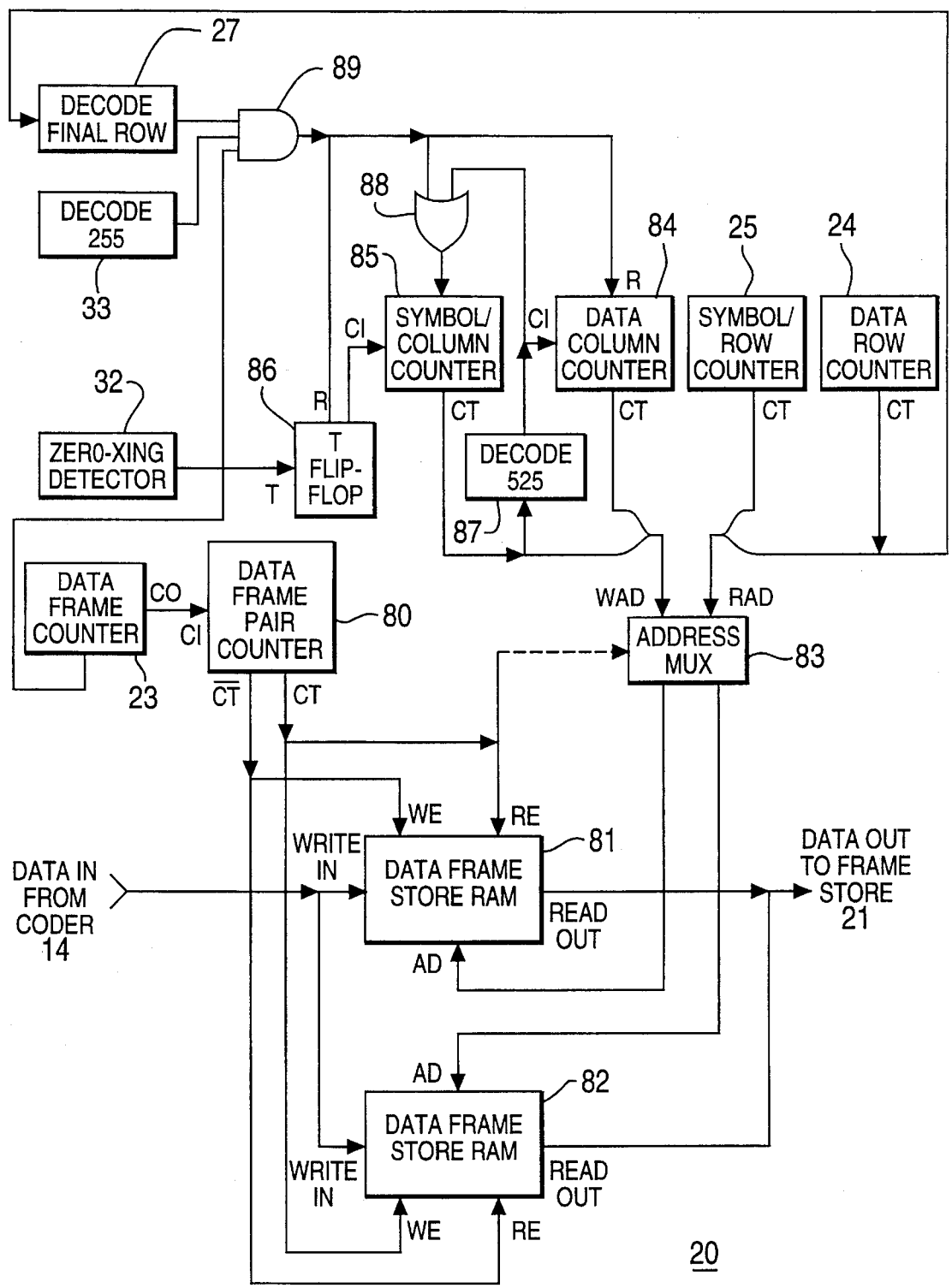

FIG. 13 is a schematic diagram of a rate buffer operated as an interleaver, which can be used in the portion of the FIG. 1 television transmitter shown in FIG. 4, as described in U.S. patent application Ser. No. 08/141,070.

Figure 14:
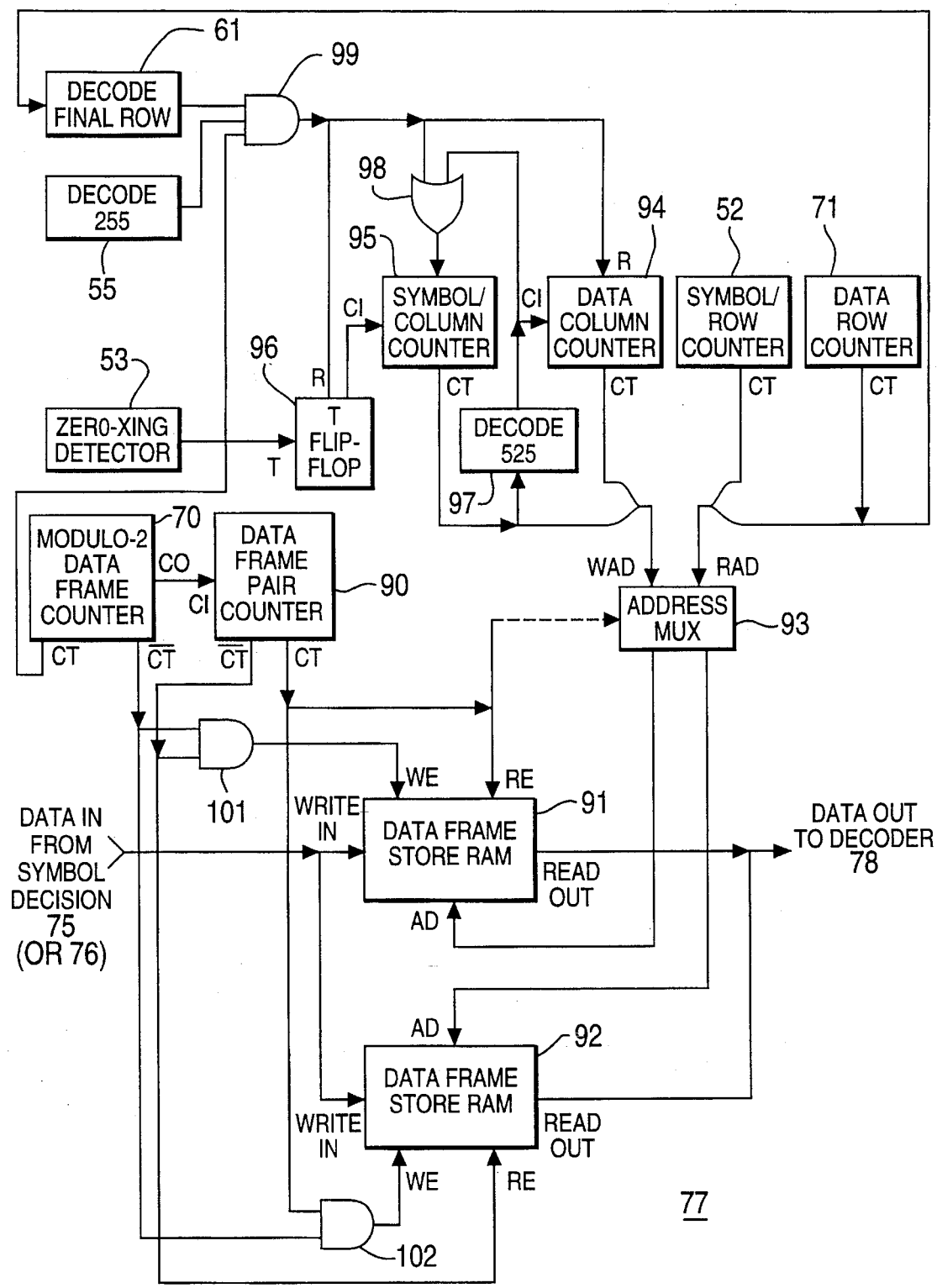

FIG. 14 is a schematic diagram of a rate buffer operated as a de-interleaver, which can be used in any of the digital-signal receivers of FIGS. 5–12, as in digital-signal receivers described in U.S. patent application Ser. No. 08/141,070.

Figure 15:
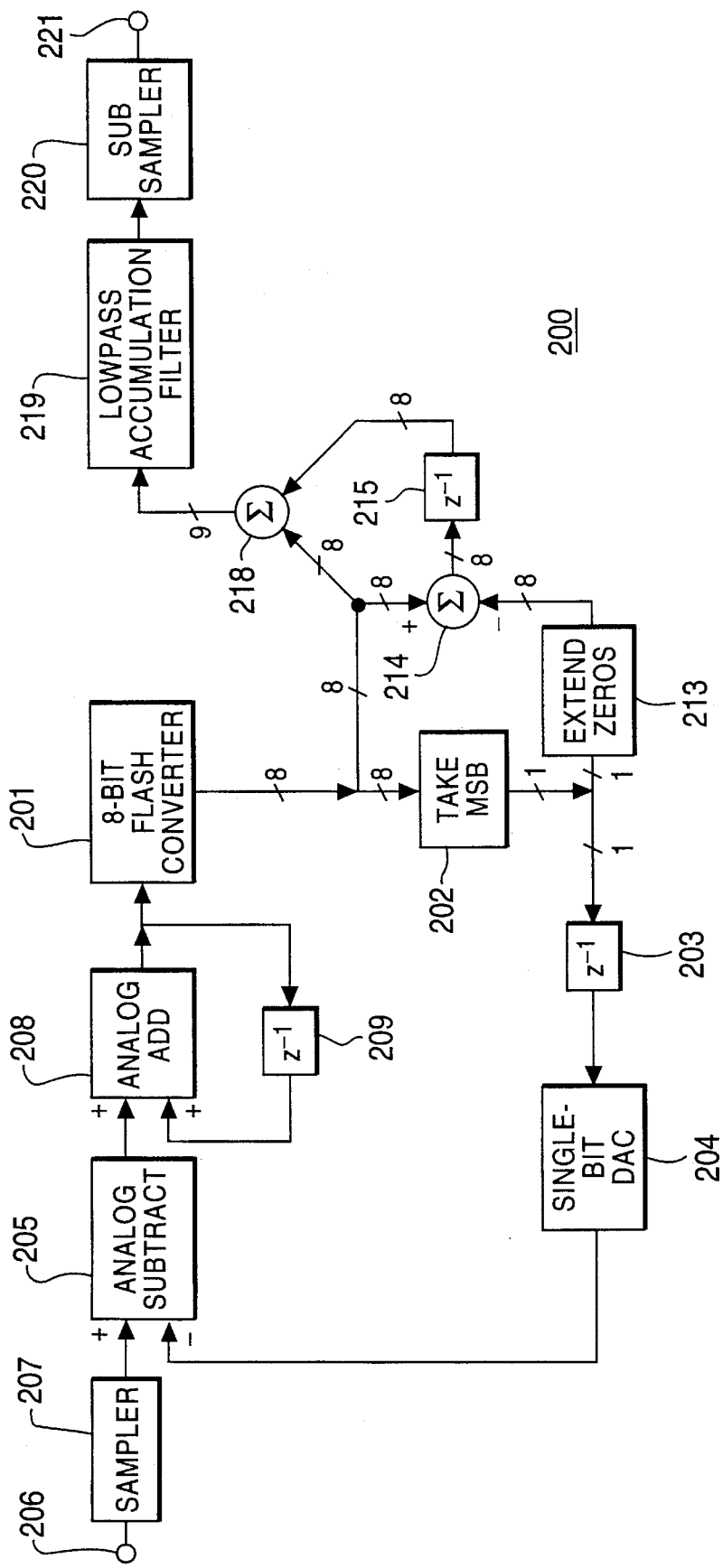

FIG. 15 is a schematic diagram of a single-loop sigma-delta converter as can be used in any of the digital-signal receivers of FIGS. 9–12, in accordance with the invention.

Figure 16:
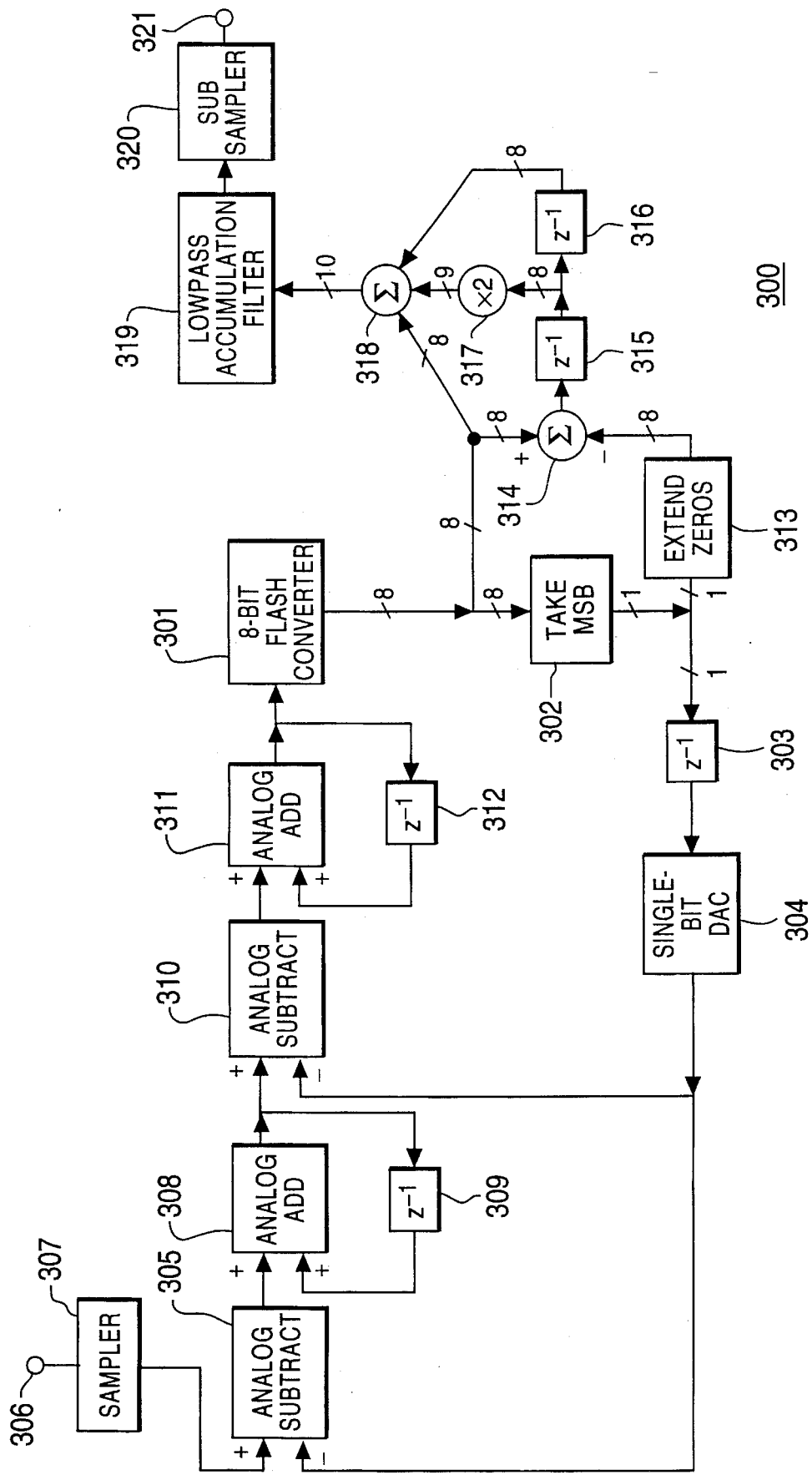

FIG. 16 is a schematic diagram of a single-loop sigma-delta converter as can be used in any of the digital-signal receivers of FIGS. 9–12, in accordance with the invention.

Figure 17:
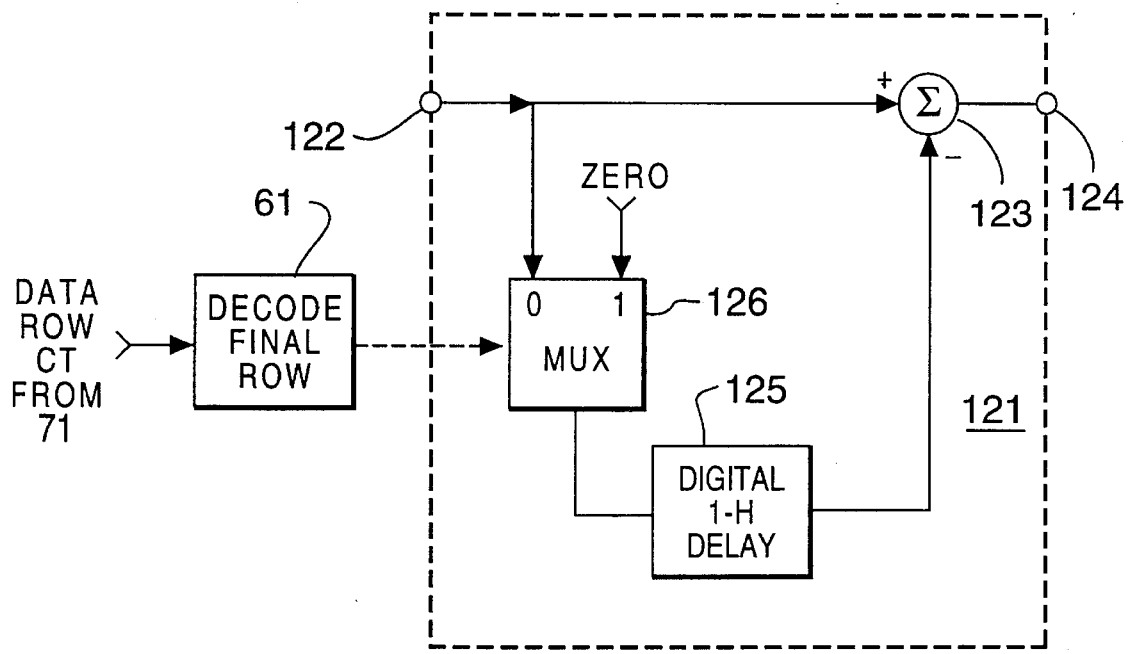
Figure 18:
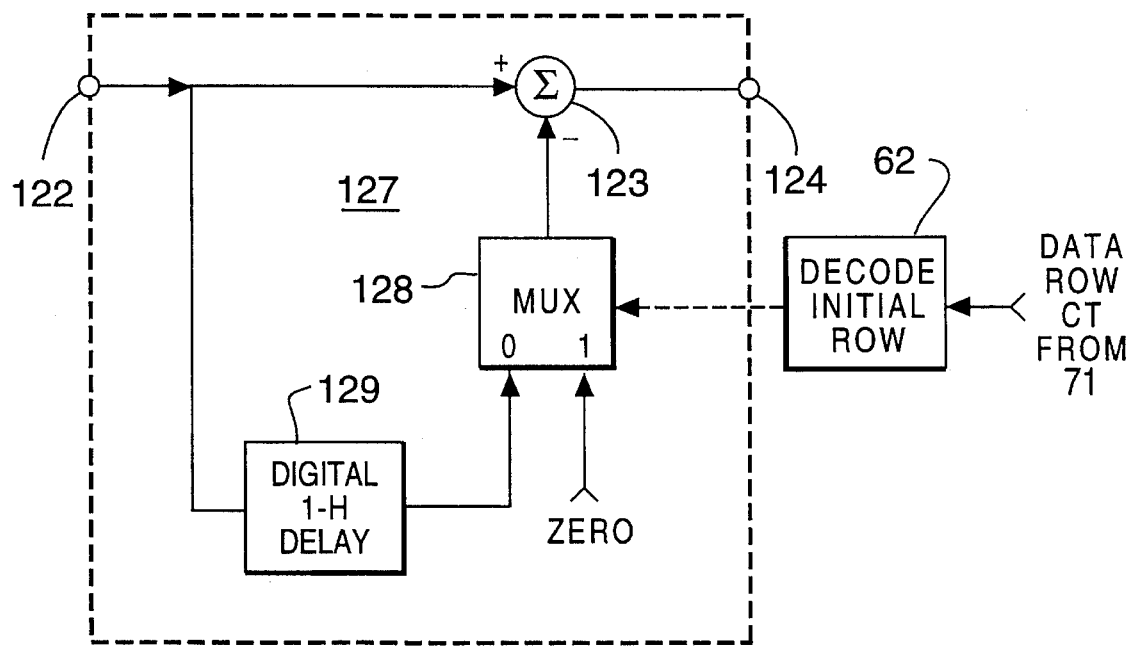

Each of FIGS. 17 and 18 is a schematic diagram showing in detail one of the different forms the line-comb filtering may take in a digital-signal receiver of one of the types shown in FIGS. 5, 6, 9 and 10.

Figures 19, 20:
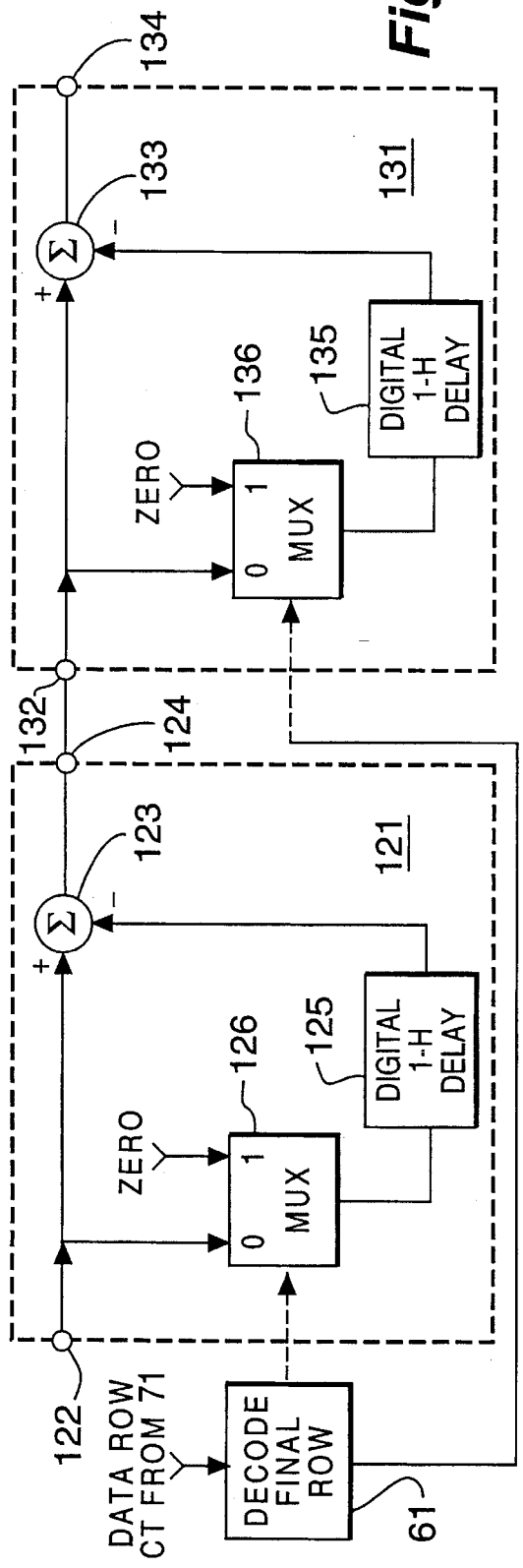

Each of FIGS. 19 and 20 is a schematic diagram showing in detail one of the different forms the line-comb filtering may take in a digital-signal receiver of one of the types shown in FIGS. 7, 8, 11 and 12.

DESCRIPTION OF THE PREFERRED EMBODIMENTS

Generally, equalizing delays have been omitted from the drawing figures to simplify them and to make them easier to understand. One skilled in the art of video signal processor design will appreciate the need for such delays to properly time-align pixels or data subject to different delays on different processing paths due to the differing processing performed in those paths. One skilled in the art would understand where such delays would be necessary and how long each of the delays would have to be, and such delays will not be described or discussed below. In logic circuitry, one skilled in the art would understand how to provide the shimming delays required to overcome undesired "logic race" conditions or to compensate for latent delays in performing logic operations; and details of logic circuitry design with regard to providing shimming delay will not be discussed below. Further, where an analog-to-digital converter (ADC) is shown or described in the present disclosure, one skilled in the art would understand the desirability of preceding such converter with an anti-aliasing lowpass filter, and how this could be implemented, and such will not be further described in detail below. Also, where a digital-to-analog converter (DAC) is shown or described in the present disclosure, one skilled in the art would understand the desirability of following such converter with a sampling clock rejection lowpass filter, and how this could be implemented, and such will not be further described in detail below.

FIG. 1 shows a television transmitter 1 for transmitting a television signal with a digital signal buried therewithin. A source 2 supplies one or more analog audio signals to audio processing circuitry 3 which supplies a modulating signal to an audio carrier transmitter 4 for modulating the frequency of the audio wave. The audio processing circuitry 3 includes delay as needed for synchronizing sound and picture. The audio processing circuitry 3, in accordance with customary practice, also includes pre-emphasis networks for the analog audio signal(s) and may include apparatus for generating stereophonic and secondary audio program (SAP) subcarriers for inclusion in the modulating signal supplied to the audio carrier transmitter 4. The frequency-modulated (FM) audio carrier is typically supplied from the transmitter 4 to a multiplexer 5 to be frequency-multiplexed with in-phase VSB AM picture carrier and quadrature-phase VSB BPSK data carrier. In a television transmitter 1 for over-the-air broadcasting, this multiplexer 5 typically takes the form of an antenna coupling network and the resulting frequency-multiplexed signal is broadcast from a transmitting antenna 6. A television transmitter for the head end of a cable broadcasting system will not have the transmitting antenna 6 used in over-the-air broadcasting. The multiplexer 5 will take different form, with the frequency-multiplexed signal from the channel under consideration being further frequency-multiplexed with the frequency-multiplexed signals from other channels, and with the resulting signal being applied by linear amplifiers to the trunk cables of the cable broadcasting system.

In FIG. 1, a source 7 supplies an analog composite video signal that is the basis for the modulating signal supplied to a transmitter 8 that in turn supplies the VSB AM picture carrier to the multiplexer 5, there to be frequency-multiplexed with the frequency-modulated (FM) sound carrier. The vertical synchronizing pulses, horizontal synchronizing pulses and color burst of analog composite video signal from the source 7 are synchronized with corresponding signals supplied by a station synchronizing signal generator 9. A control connection 10 between the source 7 of composite video signal and the station sync generator 9 symbolizes the means used for this synchronization. Where the source 7 is a remote generator of composite video signal, such as a downtown studio or another television station networked with the local television station, the control connection 10 may be a genlock connection to the station sync generator 9. Where the source 7 is a local camera, that local camera may receive synchronization information from the station sync generator 9 via the control connection 10. These and other synchronizing schemes including those for video tape recorders and telecine apparatus are familiar to those skilled in the art. Typically, a time-division multiplexer 11 is used to insert sync block information including vertical synchronizing pulses, horizontal synchronizing pulses, equalizing pulses, color burst and pedestals (commonly referred to as "porches") into the composite video signal applied as modulating signal to the picture carrier transmitter 8 in place of original sync block information.

The FIG. 1 television transmitter 1 differs from those currently used in that a further VSB AM transmitter 12 generates a vestigial-sideband, binary phase-shift-keyed (VSB BPSK) suppressed carrier in quadrature phasing with the VSB AM video carrier for NTSC composite video signal. This further VSB AM transmitter 12 can include a balanced modulator, balanced both against carrier and against BPSK modulating signal, and can further include a 90°-phase-shift network receiving in-phase video carrier from the VSB AM transmitter 8 and supplying quadrature-phase video carrier to the balanced modulator. The VSB BPSK signal from the transmitter 12, like the VSB AM video carrier amplitude-modulated by NTSC composite video signal from the transmitter 8, is supplied to the multiplexer 5, there also to be frequency-multiplexed with the frequency-modulated (FM) sound carrier. A source 13 supplies a digital signal in serial-bit form to an error-correction coder 14 for inserting additional bits of error-correcting code into the serial-bit stream applied to a frame repeater 15. The frame repeater 15 supplies each frame of data received as its input signal twice as its output signal. The output signal from the frame repeater 15 is supplied to a partial-response filter 16, which introduces correlation into the data at corresponding points in consecutive horizontal scanning lines. The digital response from the partial-response filter 16 is supplied to a digital-to-analog converter (DAC) 17, for conversion to an analog keying signal. The DAC 17 supplies a high-frequency pre-emphasis and transition-shaping filter 18 with keying signal that is of a prescribed positive value responsive to a digital ZERO and is of a prescribed negative value responsive to a digital ONE. The prescribed negative level of analog modulating signal has the same absolute value as the prescribed positive level of analog modulating signal. The filter 18 compensates for the loss in detection efficiency when synchronously detecting the VSB BPSK, which loss is attributable to transmission being only single sideband in nature. The response of the filter 18 is a keying signal supplied to a balanced modulator in the transmitter 12, which balanced modulator also receives a quadrature-phase video carrier wave to be modulated. The transmitter 8 that supplies the VSB AM video carrier amplitude-modulated by NTSC composite video signal to the multiplexer 5 is carefully designed and operated so as to avoid incidental phase modulation that might interfere with the quadrature-phase VSB BPSK suppressed carrier from the transmitter 12. Since the quadrature-phase VSB AM carrier for PSK is suppressed, the phasing of the signal in which the VSB PSK and VSB AM carriers are combined is not appreciably different from that of the in-phase VSB AM video carrier. While FIG. 1 shows the transmitters 8 and 12 as being separate from each other, in practice the same upper sideband filters and final amplifier stages can be shared by the transmitters 8 and 12.

Figure 2:
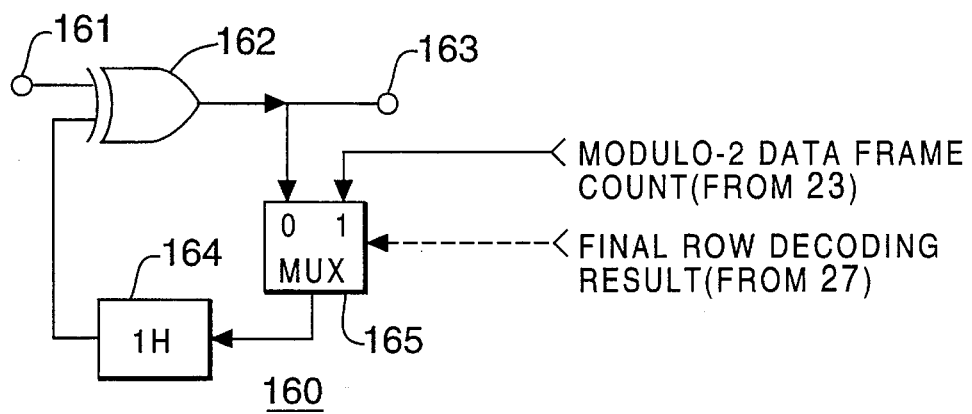
FIGS. 2 and 3 are schematic diagrams of partial-response filters, either of which can be used in the FIG. 1 television transmitter, as described in U.S. patent application Ser. No. 08/141,070.

FIG. 2 shows one form 160 the partial-response filter 16 may take. Digital input signal in serial-bit form is applied via an input terminal 161 to a first input of a two-input exclusive-OR (XOR) gate 162, the output from which connects to an output terminal 163 to supply thereto the response of the partial-response filter 160. A second input of the XOR gate 162 receives from the read output connection of a digital delay line 164 a delayed response to the output signal from a multiplexer 165 applied to the write input connection of the digital delay line 164. The digital delay line 164, which can be implemented as a cyclically addressed line storage memory operated in a read-then-write-over mode, provides "1H" delay equal to the period of one television horizontal scan line. Except when a FINAL ROW DECODING RESULT supplied as control signal to the multiplexer 165 is ONE, indicating that the final data row of a data frame is being supplied to the partial-response filter 160, the multiplexer 165 selects the partial-response filter 160 response at the output terminal 163 for application to the write input connection of the digital delay line 164.

When the FINAL ROW DECODING RESULT supplied as control signal to the multiplexer 165 is ONE, indicating that the final data row is being supplied to the partial-response filter 160, the multiplexer 165 applies MODULO-2 DATA FRAME COUNT to the write input connection of the digital delay line 164. When the MODULO-2 DATA FRAME COUNT so applied is a ZERO during the final row of the final frame of a pair of frames, a line of ZEROs is written into the digital delay line 168, so that during the first data row of the next pair of frames the data passes through the partial-response filter 160 without change. However, when the MODULO-2 DATA FRAME COUNT selected by the multiplexer 165 for application to the write input connection of the digital delay line 164 is a ONE during the final row of the initial frame of a pair of data frames, a line of ONEs is written into the digital delay line 168, so that during the first data row of the final frame in the pair of data frames the data is one's complemented by passing through the partial-response filter 160. This causes the following data rows of the final frame in the pair of data frames to be one's complements of the corresponding data rows of the preceding initial frame in that pair of data frames.

The digital filtering provided by the partial-response filter 160 suppresses DC terms in an analog signal that is generated by converting the ZEROs and ONEs of the digital response at the output terminal 163 to +1 and −1 amplitudes of a keying signal, as for controlling the generation of BPSK signals. This digital filtering exhibits peaks of response at odd multiples of one-half the horizontal-scan-line frequency fH and exhibits nulls of response at multiples of the horizontal-scan-line frequency fH. This digital filtering causes a PSK signal responsive to the data to have a comb-like frequency spectrum that complements the comb-like frequency spectrum of luminance signal, which exhibits nulls of response at odd multiples of one-half the horizontal-scan-line frequency fH and exhibits peaks of response at multiples of the horizontal-scan-line frequency fH. The partial-response filter 160 shapes the spectrum of the PSK so that it will pass through a two-tap highpass line-comb filter comprising a single 1H delay line and a subtractor. Such a highpass line-comb filter can be located in the digital signal receiver, for suppressing luminance signal having good correlation between vertically aligned pixels and reducing it as a jamming signal for the PSK.

Figure 3:
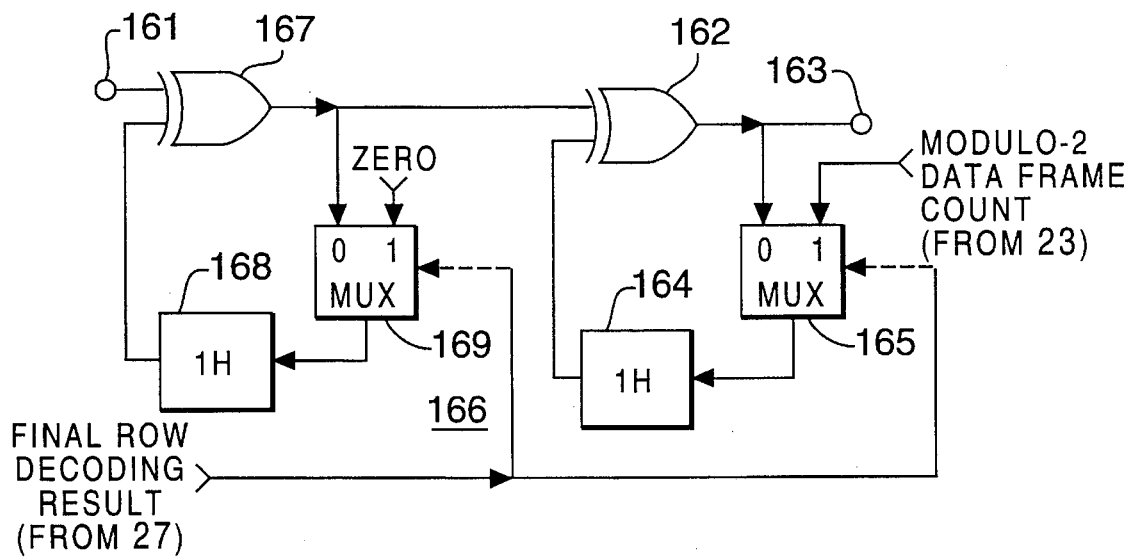

FIG. 3 shows another form 166 the partial-response filter 16 may take, which includes a final filtering section including the same elements 162–165 as the partial-response filter 160. The partial-response filter 166 further includes an initial filtering section similar to its final filtering section. This initial filtering section has a two-input exclusive-OR gate 167, with a first input to which the input terminal 161 connects and with an output to which the first input of the XOR gate 162 is connected, rather than to the input terminal 161 as in the partial-response filter 160 of FIG. 2. A second input of the XOR gate 167 receives from the read output connection of a digital delay line 168 a delayed response to the output signal from a multiplexer 169 applied to the write input connection of the digital delay line 168. The digital delay line 168, like the digital delay line 164, provides "1H" delay equal to the period of one television horizontal scan line. Except when the FINAL ROW DECODING RESULT supplied as control signal to the multiplexer 169 is ONE, indicating that the final data row of a data frame is being supplied to the partial-response filter 166, the multiplexer 169 selects the XOR gate 167 response for application to the write input connection of the digital delay line 168.

When the FINAL ROW DECODING RESULT supplied as control signal to the multiplexer 169 is ONE, indicating that the final data row is being supplied to the partial-response filter 166, the multiplexer 169 applies a wired ZERO to the write input connection of the digital delay line 164. This writes a row of ZEROs into the digital delay line 164 during the final row of each data frame. This row of ZEROs is supplied to the XOR gate 167 during the initial row of the next data frame so the initial row of data is transmitted by the XOR gate 167 to the XOR gate 162, for selective one's complementing as described with regard to the partial-response filter 160 of FIG. 2.

The partial-response filter 166 has a sharper-toothed comb response than the partial-response filter 160, but also exhibits nulls of response at odd multiples of one-half the horizontal-scan-line frequency fH and exhibits peaks of response at multiples of the horizontal-scan-line frequency fH. In the digital signal receiver a three-tap highpass line-comb filter can be used for restoring the PSK signal to a flat frequency spectrum and reducing luminance signal as a jamming signal for the PSK.

FIG. 4 shows in more detail the construction of the portion of the FIG. 1 TV transmitter 1 used for digitally filtering the digital data from which the phase-shift keying signal is to be generated. The error-correction coder 14 supplies digital signal in serial-bit form to a ram buffer 20. Preferably, the coder 14 is of a type generating modified Reed-Solomon codes; and the rate buffer 20 performs dual service as an interleaver. Interleaver operation of the rate buffer 20 places the original order of the scanning of data in columns, transverse to rows of data ultimately transmitted by the VSB BPSK data transmitter 12 simultaneously with respective horizontal scan lines of the composite video signal being transmitted by the VSB AM video transmitter 8. This is done so impulse noise and midband frequencies of composite video signal, which tend to have coherence in the horizontal direction, jam fewer bits of the modified Reed-Solomon codes than would be the case with modified Reed-Solomon codes operating on data mapped into rows along horizontal scan lines, rather than on data mapped into columns transverse to horizontal scan lines. In any case, the rate buffer 20 is a memory that supplies the bits on a regularly timed basis to a frame-store memory 21 for writing during, and only during, alternate data frames. Data frames are defined as blocks of 525 rows of symbols which occur at a symbol rate that is a multiple of data row scan rate, which data row scan rate is the same as the horizontal scan line rate for analog composite video signal. BPSK symbols are bits, but the symbols to which the modified Reed-Solomon codes are applied are customarily 2N-bit data, N being a small positive integer such as three, four or five. The bit length over which each of the modified Reed-Solomon codes extends is chosen to be less than 525 (e.g., 256 or 512), so that impulse noise is less likely to disrupt any one of the modified Reed-Solomon codes more than once along its length.

The relative phasing of the data rows and the horizontal scan lines of composite video signal is such that each data row coincides in time with a respective horizontal scan line of composite video signal. Data frames occur at the same rate as the frames of the analog composite video signal supplied by the source 7, but it is convenient to have the data frames lag the video signal frames by nine horizontal scan lines of composite video signal for reasons disclosed further on in this specification. The frame-store memory 21 is read the first data frame following its being written and is re-read before re-writing in the second data frame following its being written, to generate output signal supplied as input signal to the partial-response filter 16 during respective frames of consecutive pairs of data frames. The writing and reading of the rate buffer 20 and of the frame-store memory 21 are controlled by frame-store packing-control circuitry 22.

A frame counter at the transmitter 1 used to count four-frame cycles for controlling the insertion of ghost-canceling reference signals into the composite video signals during selected vertical-blanking interval (VBI) scan lines includes, as a stage thereof, a modulo-2 data frame counter 23 used in timing the read and read-then-write over operations of the frame-store memory 21 during respective frames of each consecutive pair of data frames. The packing-control circuitry 22 also receives a DATA ROW COUNT signal from a data row counter 24 and a SYMBOL COUNT signal from a symbol counter 25, which the packing-control circuitry 22 applies to the frame-store memory 21 as row addressing and as within-row read addressing, respectively. DATA ROW COUNT and SYMBOL COUNT together comprise the complete addressing AD the packing-control circuitry 22 applies to the frame-store memory 21 in FIG. 4. The circuitry 22 also generates a write enable signal WE for the frame-store memory 21, read addressing RAD supplied to the rate buffer 20 in synchronism with the complete addressing AD supplied to the frame-store memory 21 during the writing thereof, and write addressing WAD for the rate buffer 20. When the digital data is selectively transmitted, the circuitry 22 also generates a read enable signal RE for the frame-store memory 21.

More particularly, the mode of operation can be as follows. The DATA FRAME COUNT bit is supplied from the frame counter 23 to the packing-control circuitry 22, there to be used to generate WRITE ENABLE signal for the frame-store memory 21 only when the modulo-2 DATA FRAME COUNT bit is ZERO. The packing-control circuitry 22 supplies READ ENABLE and WRITE ENABLE signals that condition the frame-store memory 21 to operate in a read-then-write-over mode when the modulo-2 DATA FRAME COUNT bit is ZERO. When the modulo-2 DATA FRAME COUNT bit is ONE, the packing-control circuitry 22 supplies READ ENABLE signals only.

A final row decoder 27 is supplied DATA ROW COUNT signal from a data row counter 24 and generates control signal for the multiplexer 165 in the partial-response filter 16 and for the multiplexer 169 if it is used in the filter 16. The final row decoder 27 supplies a ZERO output signal as FINAL ROW DECODING RESULT responsive to all values of DATA ROW COUNT except that indicative of the final row in the data frame, which ZERO output signal conditions the multiplexer 165 (and the multiplexer 169 if used) in the filter 16 to implement normal partial-response filtering by the filter 16. Responsive to DATA ROW COUNT being indicative of the final row in the data frame, the final row decoder 27 supplies a ONE response to the multiplexer 165 (and the multiplexer 169, if used) in the filter 16 to condition the loading of the 1-H delay line 164 (and the 1-H delay line 168, if used) with initial conditions in the filter 16 for the next data frame. The modulo-2 data frame counter 23 supplies MODULO-2 DATA FRAME COUNT as alternative input signal to the multiplexer 165, to be selected to the write input connection of the 1-H delay line 164 when the final row decoder 27 supplies a ONE to the multiplexer 165 as its control signal.

FIG. 4 shows symbol clocking circuitry 30 that includes, in addition to the symbol counter 25, a voltage-controlled oscillator (VCO) 31, a zero-crossing detector 32, a 255-count decoder 33 and an automatic frequency and phase control (AFPC) detector 34. The symbol counter 25 comprises eight binary counting stages. The zero-crossing detector 32, which might be more properly termed an average-axis-crossing detector, generates a pulse whenever the sinusoidal oscillations of the oscillator 30 cross their average axis in a prescribed direction. The zero-crossing detector 32 customarily comprises a limiter amplifier that generates square waves responsive to the sinusoidal oscillations of the VCO 31, a differentiator for generating pulses responsive to transitions of these square waves, and a clipper for separating pulses of one polarity to be supplied to the frame-store packing-control circuitry 22 for timing purposes. These pulses are also supplied to the symbol counter 25 to be counted in each consecutive line, thereby to generate the SYMBOL COUNT signal supplied to the packing-control circuitry 22. The 255-count decoder 33 decodes the SYMBOL COUNT reaching 255 to generate a pulse. Instead of letting the SYMBOL COUNT simply roll over to arithmetic zero because full count is an integral power of two, each pulse from the 255-count decoder 33 can be used to reset the counter 25 on the next pulse supplied to the counter 25 by the zero-crossing detector 32, thus returning SYMBOL COUNT to arithmetic zero. The 255-count decoder 33 supplies pulses to the AFPC detector 34, to be compared with the horizontal sync pulses H to develop an AFPC voltage supplied to the VCO 31. This completes a negative feedback loop that adjusts the frequency of the VCO 31 oscillations to be 255 times the horizontal scan line frequency, or 4,027,972 Hz.

One way of synchronizing counting by the modulo-2 data frame counter 23 and the data row counter 24 with the frames of analog composite video signal will now be considered. In a digital signal receiver for a system as described in this specification, it is preferable to synchronize the counter that regenerates DATA FRAME COUNT to the beginning of line 10 of each frame of the analog composite video signal, just after the trailing edge of the vertical sync pulse in the initial field of such frame. In such case, the counter that generates DATA ROW COUNT in the digital signal receiver is reset to prescribed count value at the beginning of line 10 of each frame of the analog composite video signal. The synchronizing of the counting by the modulo-2 data frame counter 23 and the data row counter 24 in the portion of the transmitter 1 shown in FIG. 4 conforms to the desired receiver practice.

The 255-count decoder 33 output signal is supplied as a first input signal to a two-input AND gate 36. The station sync generator 9 supplies vertical sync pulses V to a trailing edge detector 35, which supplies pulses at the conclusions of lines 9 of composite video signal and at the midpoints of lines 271 of composite video signal output signal is supplied as a second input signal to the AND gate 36. The response of the AND gate 36 consists of DATA-FRAME-END pulses at the conclusions of lines 9 of composite video signal. Each of these DATA-FRAME-END pulses is applied as a trigger pulse to the modulo-2 data frame counter 23, so as to advance the DATA FRAME COUNT signal, and is also applied to the data row counter 24 to reset its DATA ROW COUNT to prescribed initial value. In practice, the 255-count decoder 33 may be dispensed with, and the carry pulses from the final binary counting stage of the symbol counter 25 may be supplied to the AFPC detector 34 and to the AND gate 36 instead of the decoder 33 output signal.

The transmitting apparatus described above with reference to FIGS. 1–4 of the drawing is the same as that described in U.S. patent application Ser. No. 08/141,070. The digital signal receivers described below with reference to FIGS. 5–12 of the drawing embody the invention.

Figure 5:
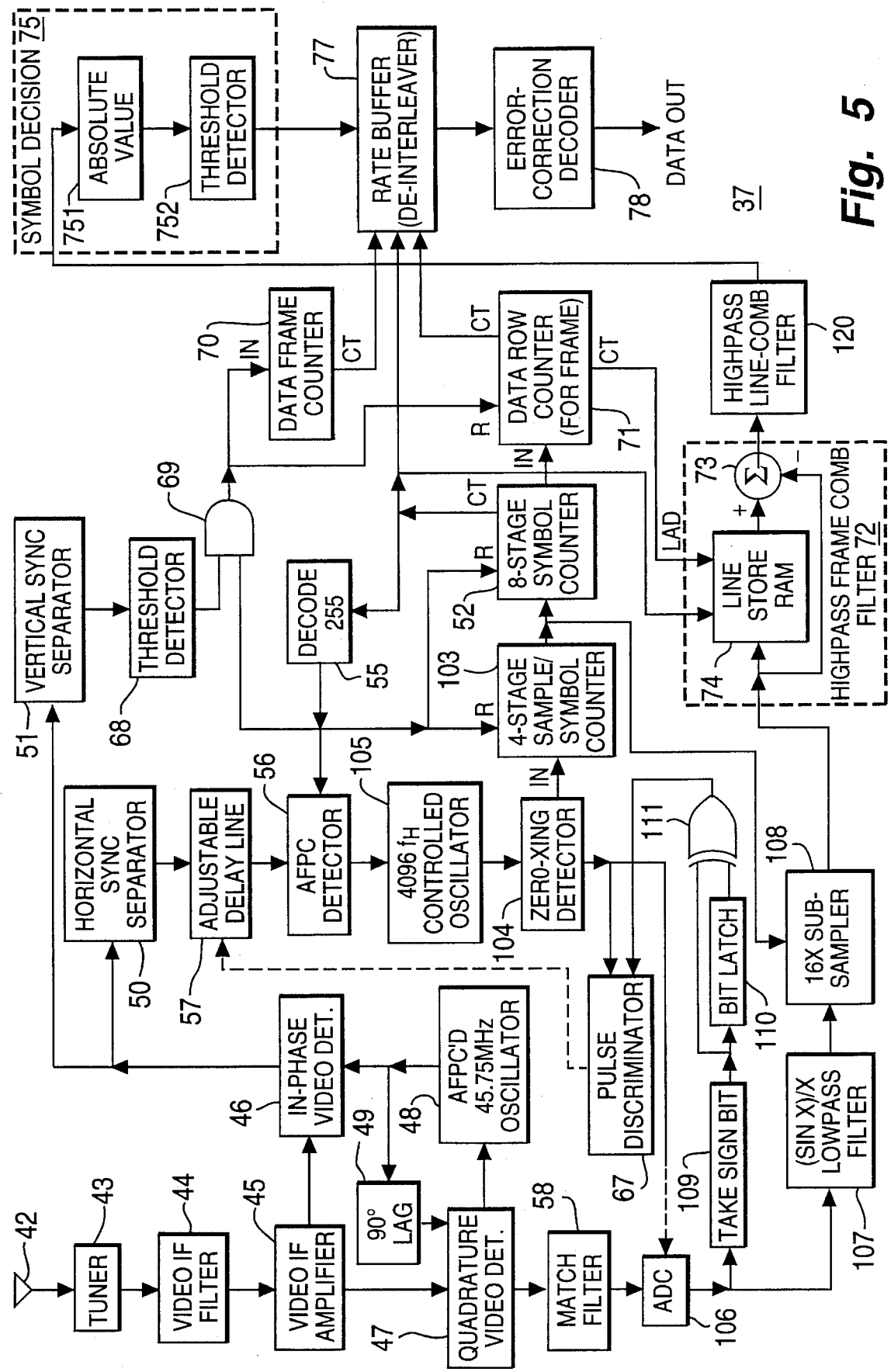

FIG. 5 shows a digital-signal receiver 37 for receiving, from means such as an antenna 42, a television signal with a digital signal buried therewithin and extracting the buried digital signal. A tuner 43 selects the television channel to be detected by the first detector therein, which first detector is a tunable downconverter, conventionally of superheterodyne type, for converting the selected television signal to a set of intermediate frequencies and an image set of frequencies. A video intermediate-frequency (IF) filter 44 selects the video intermediate frequencies for application as input signal to an intermediate-frequency (IF) amplifier 45 and rejects the image set of frequencies. Following the current custom a surface-acoustic-wave (SAW) filter can be used for the video IF filter 44 and to construct the video IF amplifier 45 within a monolithic integrated circuit (IC), as a multi-stage amplifier without interstage tuning. The video IF amplifier 45 supplies the amplified video IF signal to an in-phase synchronous video detector 46 and to a quadrature-phase synchronous video detector 47. An oscillator 48 oscillating with a nominal frequency of 42.75 MHz supplies its oscillations to the in-phase synchronous video detector 46 without phase shift and to a quadrature-phase synchronous video detector 47 with 90° lagging phase shift provided by a shift network 49. The oscillator 48 has automatic frequency and phase control (AFPC) responding to the output signal of the quadrature-phase synchronous video detector 47. The synchronous video detectors 46 and 47 are customarily included together with the video IF amplifier 45 and portions of the oscillator 48 within the IC. Each of the video detectors 46 and 47 may either be of exalted carrier type or of true synchronous type. In-phase modified composite video signal recovered by the in-phase synchronous video detector 46 is supplied to a horizontal sync separator 50 and to a vertical sync separator 51, which recover horizontal and vertical synchronizing pulses from the in-phase modified composite video signal, respectively.

The aspects of the digital-signal receiver 37 thus far considered are generally familiar to persons skilled in the art of TV receiver design, although the video IF filter 44 is preferably made only about 3.5 MHz wide and is centered at 45.25 MHz. This video IF filter 44 provides chroma rejection and in-channel sound rejection without need for chroma and in-channel sound rejection filtering after the quadrature-phase video detector 47. (When the digital-signal receiver 37 is constructed together with a television receiver, the video IF filter 44 may be widened, with chroma and in-channel sound rejection provided by filtering after the quadrature-phase video detector 47.) The bandwidth of the quadrature-phase video detector 47 should be somewhat wider than symbol rate, so as not to attenuate the upper frequencies in the "tail" of BPSK response. The quadrature-phase video detector 47 detects the keying signal, accompanied by only those portions of the NTSC composite video signals at frequencies above 750 kHz.

In practice the digital receiver 37 usually will include ghost suppression circuitry, which is not separately and explicitly shown in FIG. 5, but can be of the type described in detail in U.S. patent application Ser. No. 08/108,311 filed Aug. 20, 1993. Each of the in-phase and quadrature-phase video detectors 46 and 47 includes, after its synchronous detector per se, respective ghost cancellation and equalization filters similar to those used after the synchronous detector per se included in the other video detector. The adjustable parameters of the two ghost-cancellation filters are adjusted in parallel responsive to calculations made in a computer, and the adjustable parameters of the two equalization filters are also adjusted in parallel responsive to further calculations made in the computer. Ghost-cancellation reference (GCR) signals, which extend up to 4.1 MHz in frequency when transmitted, but extend to only 2.5 MHz or so in a digital signal receiver because of its limited IF bandwidth, are extracted from selected vertical-blanking-interval (VBI) scan lines of the video signal detected by the in-phase synchronous video detector 46. The GCR signals are digitized and supplied as input signal to the computer for calculating the adjustable parameters of the ghost-cancellation and equalization filters. Alternatively or additionally, direct-current or low-frequency components in the quadrature-phase video detector 47 response can be sensed and used as a basis for calculating the adjustable parameters of the ghost-cancellation filters.

In the FIG. 5 digital-signal receiver 37, a SAMPLE/SYMBOL COUNT signal is generated by a sample/symbol counter 103 counting pulses generated by a zero-crossing detector 104 in response to sinusoidal oscillations received from a voltage-controlled oscillator 105. A SYMBOL COUNT signal is generated by a symbol counter 52 counting overflow carries from the sample/symbol counter 103. A decoder 55 decodes the SYMBOL COUNT reaching 255 to generate a pulse. The trailing edge of this pulse resets the counters 103 and 52, returning both SAMPLE/SYMBOL COUNT and SYMBOL COUNT to arithmetic zero. The pulses generated by the decoder 55 are supplied to an AFPC detector 56 to be compared to the horizontal sync pulses H separated by the horizontal sync separator 50 and adjustably delayed for fractions of a symbol interval by a controlled delay line 57. The results of the comparison are lowpass filtered within the AFPC detector 56 to generate an automatic frequency and phase control (AFPC) voltage signal for application to the VCO 105. These arrangements control the frequency of the oscillations supplied from the line-locked VCO 105 to be 16×256=4,096 times the horizontal scan line frequency fH, or 64,447,545 Hz. The term "line-locked" used in reference to a controlled oscillator means that the frequency of its oscillations is maintained in constant ratio to the 15,734.264 Hz scan line frequency, which is customarily done by AFPC circuitry comparing the frequency of its oscillations as divided by a suitable factor to horizontal synchronizing pulses.

The keying signal and accompanying portions of the NTSC composite video signals at frequencies above 750 kHz detected by the quadrature-phase video detector 47 are supplied to a match filter 58, which responds to the keying signal but only to selected portions of the accompanying above-750-kHz frequency components of composite video signal. The match filter 58 provides a peaking response that matches with the roll-off of the transition-shaping portion of the filter 18 in the transmitter to extend PSK bandwidth enough to reduce inter-symbol interference. The match filter 58 can also provide further peaking response to compensate for the roll-off of the detection efficiency of the quadrature-phase video detector 47 attributable to the VSB BPSK becoming increasingly single sideband in nature over the frequency range extending between 0.75 and 1.25 MHz and being substantially single sideband in nature over the frequency range extending upward from 1.25 MHz. However, since the vestigial sideband filters of different TV transmitters exhibit variations from each other, the peaking response to compensate for the roll-off of the detection efficiency of the quadrature-phase video detector 47 is probably better done at each TV transmitter 1, by modifying the transition shaping filter 18 to provide the appropriate peaking response in addition to shaping transitions. This additional peaking or pre-emphasis of binary keying signal at the transmitter 1 will, however increase the high frequency content of the BPSK above 0.75 MHz that is transmitted together with luminance signal.

The response from the match filter 58 is applied as input signal to an analog-to-digital converter (ADC) 106, which, by way of example, is a flash converter with 8-bit resolution. The quadrature-phase video detector 47 recovers substantially no composite video signal frequencies below 750 kHz and the BPSK coding is such that it has no zero-frequency content. During the transmission of TV images without much energy in the frequencies above 750 kHz, the BPSK portion of the quadrature-phase synchronous video detector 47 response will alternate from one polarity to the other. Positioning one of the decision thresholds for quantizing input signal to the ADC 106 at zero analog input level assures that the BPSK portion of the quadrature-phase synchronous video detector 47 response will cause changes in the digital response of the ADC 106 during the transmission of TV images without appreciable energy in the frequencies above 750 kHz, even if the bit-resolution of the ADC 106 is appreciably lower than eight bits. The non-responsiveness of the detector 47 to the low-frequency components of synchronizing pulses reduces below 140 IRE units the dynamic range of the remnants of composite video signal the detector 47 responds to and which should be within the dynamic range capability of the ADC 106 at its analog input port. If the ADC 106 has 8-bits resolution and the BPSK is about 3 IRE units in amplitude, five to six decision thresholds will be crossed by the BPSK. This is well above quantizing noise, so TV images with appreciable energy in the frequencies above 750 kHz will not be able to position the BPSK portion of the quadrature-phase synchronous video detector 47 response between adjacent decision thresholds. However, if the symbol decision circuitry has to make symbol decisions on ternary keying signals, as will be shown to be the case in the digital signal receivers 37 and 38 of FIGS. 5 and 6, about sixteen decision thresholds should be crossed by the BPSK to assure low symbol error. If the symbol decision circuitry has to make symbol decisions on 5-level keying signals, as will be shown to be the case in the digital signal receivers 39 and 40 of FIGS. 7 and 8, as many as 32 decision thresholds should be crossed by the BPSK to assure low symbol error.

Therefore, in preferred embodiments of the invention, the ADC 106 is operated as an oversampling analog-to-digital converter, sampling the response from the match filter 58 each time a zero crossing is detected by the zero-crossing detector 104. Accordingly, ADC 106 samples at sixteen times the symbol rate of 256 times horizontal scan line rate fH, so that an additional four bits of resolution can be obtained from the 8-bit ADC 106 through oversampling. The digital response of the ADC 106 is supplied as input signal to a finite-impulse-response (FIR) digital lowpass filter 107. The filter 107 is a multiple-tap digital delay line, the signals from the successive taps of which are symmetrically weighted in accordance with a (sin x)/x function before summation that generates a lowpass filter response. The lowpass filter response from the filter 107 is supplied to a sixteen-times subsampler, or decimator, 108 that supplies 12-bit analog-to-digital conversion response at the BPSK symbol rate of 256 times horizontal scan line rate fH. The decimation by the sixteen-times subsampler 108 reduces the amount of storage capability required in the delay portions of the digital comb-filtering to follow. Sampling at symbol rate from the oversampler 108, with optimal phasing, is a form of synchronous symbol detection which suppresses response to those components of the composite video signal that exhibit change at symbol rate, but are in quadrature phasing with the sampling at symbol rate.

There is a wired taking 109 of the sign bit of the digitized response from ADC 106. That sign bit and that sign bit as delayed one sample in a bit latch 110 are supplied as respective inputs to an exclusive-OR gate 111. The XOR gate 111 detects the zero-crossings of the digitized response from ADC 106, supplying the results of this detection to a pulse phase discriminator 67. The pulse phase discriminator 67 selectively detects departures of the zero-crossings of the ADC 106 response, as detected by the XOR gate 111, from proper phasing respective to the zero-crossings of the oscillations of the controlled oscillator 105, as detected by the zero-crossing detector 104. The pulse phase discriminator 67 lowpass filters these selectively detected departures, as sampled and held, thereby to generate a control signal for adjusting the delay the controlled delay line 57 provides for the horizontal sync pulses H applied to the AFPC detector 56. This selective detection by the pulse phase discriminator 66 can be done during portions of the vertical blanking interval when the response of quadrature-phase video detector 47 to composite video signals is expected to be zero-valued. The phasing of the sampling, at symbol rate, of the ADC 106 input signal during its digitization is accordingly adjusted for minimal inter-symbol interference.

The arrangements for adjusting the phasing of the line-locked oscillator are of the type developed by Jung-Wan Ko, a co-worker of the inventors, and are described in detail in his U.S. patent application Ser. No. 08/207,684 filed Mar. 9, 1994, entitled SYMBOL CLOCK REGENERATION IN DIGITAL SIGNAL RECEIVERS FOR RECOVERING DIGITAL DATA BURIED IN NTSC TV SIGNALS, and assigned to Samsung Electronics Co., Ltd., pursuant to pre-existing employee agreement to assign inventions made within the scope of his employment. The AFPC loop controlling the frequency and phasing of the oscillations of the controlled oscillator 105 with respect to the adjustably delayed horizontal sync pulses H supplied from the controlled delay line 57 provides a filtering function that avoids the ADC 65 clocking exhibiting a "glitch" or pronounced shortening of periodicity during phase adjustment. Such glitches occur at times if fine phase adjustment is attempted in the ADC 65 clocking itself.

The vertical sync separator 51 supplies "lossy" integrated response to separated vertical sync pulses V to a threshold detector 68, the threshold voltage of which is chosen such that it is exceeded only when the vertical sync pulses are integrated over more than five-and-a-half scan lines and less than six-and-a-half scan lines. The threshold detector 68 output signal, which is a ONE only when its input signal exceeds its threshold voltage and is otherwise a ZERO is supplied as a first input signal to a two-input AND gate 69. The decoder 55, which generates a ONE for the final value of SYMBOL COUNT in each data row (at the finishes of horizontal scan lines) and otherwise generates a ZERO, supplies its output signal to the AND gate 69 as a second input signal thereto. The AND gate 69 is responsive to the trailing edges of vertical pulses that occur at the beginning of the initial fields of composite video signal frames, to provide a respective DATA-FRAME-END pulse responsive to each of these edges, but is not responsive to the trailing edges of vertical pulses that occur between respective initial and final fields of frames.

The DATA-FRAME-END pulses in the AND gate 69 response are supplied to a modulo-2 data frame counter 70 as count input (CI) signal, so as to advance a regenerated DATA FRAME COUNT signal, which is offset by one scan line from the DATA FRAME COUNT signal at the transmitter. As noted in U.S. patent application Ser. No. 08/108, 311, the best way to arrange for synchronizing the DATA FRAME COUNT in the TV transmitter 1 and in the digital data receiver 37 is by reference to the GCR signals which occur in prescribed permutations of burst phasing and Bessel chirp phasing in the 19th scan lines of a four-frame cycle. The single-binary-stage counter 70, which generates modulo-two DATA FRAME COUNT will often be one stage in a plural-binary-stage counter that generates a modulo-2N DATA FRAME COUNT, N being a positive integer at least two, which plural-binary-stage counter is used for timing the accumulation of the GCR signals.

The DATA-FRAME-END pulses in the AND gate 69 response are also applied as a reset (R) signal to a data row counter 71 to reset the DATA ROW COUNT regenerated as its output signal, which should then be 524, to arithmetic zero. The data row counter 71 is connected to count the horizontal sync pulses H supplied from the horizontal sync separator 50. The DATA ROW COUNT is used to control the selection of the VBI scan lines containing GCR signals in the circuitry (not explicitly shown in FIG. 5) for acquiring data for the computer (also not explicitly shown in FIG. 5) that calculates the adjustable filtering parameters for the equalization and ghost-cancellation filters included within the video detectors 46 and 47.

A highpass frame-comb filter 72 receives the digital response of the subsampler 108 as input signal. The highpass frame-comb filter 72 comprises a digital subtractor 73 and a digital framestore 74 responding to signal samples applied to its input port to supply those signal samples at its output port the duration of one frame scan later in time. The digital framestore 74 is conveniently constructed as a RAM operated in a read-then-write-over mode. This RAM receives the DATA ROW COUNT from the counter 71 as line addressing (LAD) and the SYMBOL COUNT from the counter 52 as symbol addressing (SAD). The subtractor 73 receives as a minuend input signal from the subsampler 108 samples of the digitized keying signal for the current frame and receives as a subtrahend input signal the corresponding samples of the digitized keying signal for the previous frame from the framestore 74. The difference signal from the subtractor 73 is the highpass frame-comb filter 72 response, from which remnant luminance components that exhibit frame-to-frame correlation are removed.

A highpass line-comb filter 120 receives this response as its input signal. The highpass line-comb filter 120 is a match filter for the partial-response filter 160 of FIG. 2 being used for the partial-response filter 16 in the FIG. 1 transmitter 1. The highpass line-comb filter 120 suppresses the components of the composite video signal that accompany the detected keying signal but do not exhibit line-to-line change. The particular structure of the filter 120 will be described further on in this specification with reference to FIGS. 17 and 18 of the drawing.

The analog signal that is supplied as input signal to the highpass line-comb filter 59 in part is descriptive of binary coding of keying signal, but the output signal from the highpass line-comb filter 59 in part is descriptive of ternary coding of keying signal and is digitized by the ADC 65 to supply input signal for the highpass frame-comb filter 72. The digitized signal that is supplied as output signal from the highpass frame-comb filter 72 is still descriptive of ternary coding of keying signal in alternate dam frames that are valid data frames, since those data frames combine two data frames in which corresponding digital samples are of similar amplitudes and opposite polarities. In the intervening alternate data frames that are invalid data frames, the digitized signal that is supplied as output signal from the highpass frame-comb filter 72 is 5-level in nature, but symbol decisions based on the invalid data frames are of no concern.

The analog signal that is supplied as input signal to the ADC 106 in part is descriptive of binary coding of keying signal; therefore, so is the digital signal supplied as input signal to the highpass frame-comb filter 72. The digital response from the highpass frame-comb filter 72 supplied as input signal to the highpass line-comb filter 120 is still descriptive of binary coding of keying signal in alternate data frames that are valid data frames, in those data frames the subtractor 73 differentially combines two data frames in which corresponding digital samples are of similar amplitudes and opposite polarities. In the intervening alternate data frames that are invalid data frames, the digital response from the highpass frame-comb filter 72 supplied as input signal to the highpass line-comb filter 120 is ternary in nature, since in those data frames the subtractor 73 differentially combines two data frames in which corresponding digital samples are at times of similar amplitudes and opposite polarities, but are at other times of similar amplitudes and similar polarity, which similar polarity may be either positive or negative. During these invalid alternate data frames, the digital response from the highpass line-comb filter 120 is 5-level in nature, but symbol decisions based on the invalid data frames are of no concern. During the valid alternate data frames, the digitized signal that is supplied as input signal to the highpass line-comb filter 120 is descriptive of binary coding of keying signal, and accordingly the digital response from the highpass line-comb filter 120 is descriptive of ternary coding of keying signal.

Symbol decision circuitry 75, which receives the highpass line-comb filter 120 digital response as its input signal, accordingly has three comparator ranges respectively centered on −1 and 0 and +1. Symbol decision circuitry 75 includes an absolute-value circuit 751, which generates a rectified digital response to the output signal from the highpass line-comb filter 120. The rectified digital response of the absolute-value circuit 751 is descriptive of binary coding of keying signal and is supplied to a threshold detector 752.

The threshold detector 752 is a type of symbol decision circuit well known in the art of digital communications for making symbol decisions with regard to binary coding of keying signal. The threshold detector 752 receives the symbol stream from absolute-value circuit 751 and makes a decision as to whether the symbol is most likely a ZERO or is most likely a ONE. The threshold detector 752 typically contains a digital comparator arranged to operate as threshold detector, with the threshold detection results being used to control the decision as to whether the symbol is most likely a ONE or is most likely a ZERO depending on whether or not a threshold digital value is exceeded. The threshold detector 752 is preferably of a type in which the threshold digital value for threshold detection is automatically adjusted responsive to symbol strength. In such case, the threshold detector 752 has associated with it circuitry for detecting the average peak level of the symbol stream supplied by absolute-value circuit 751, or its average level, or both. There is associated circuitry for reckoning from each level detected the digital value supplied to the comparator to establish the threshold for threshold detection. The detection procedures for determining symbol decision thresholds preferably are selectively implemented during the vertical blanking interval, when the composite video signal contributes almost no energy to the signal detected by the quadrature-phase video detector 47.

The symbol stream from the symbol decision circuitry 75 is supplied as input signal to a rate buffer 77, which is conditioned by the DATA FRAME COUNT to accept input samples from only those alternate frames in which keying signal is not canceled, but in which luminance signal components that do not exhibit frame-to-frame change are canceled. Digital samples are supplied to the rate buffer 77 at symbol rate and issue from the rate buffer 77 at one-half symbol rate for application to an error-correction decoder 78. Decoder 78 receives the results of the decisions by the symbol decision circuitry 75 as serial-bit digital input data and corrects the errors therein to provide corrected serial-bit digital data, which are the output data of the digital signal receiver 37 and should correspond to the serial-bit digital data that FIG. 1 shows the source 13 to supply to the television transmitter 1.

In preferred embodiments of the digital signal receiver 37, designed to be used with a transmitter 1 using modified Reed-Solomon codes operating on columns of data transverse to horizontal scan lines, rather than on rows of data along horizontal scan lines, the rate buffer 77 is operated as a de-interleaver for the error-correction decoder 78. The write address generator for the rate buffer 77 is not shown in FIG. 5. The read address generator comprises the data row counter 71 supplying DATA ROW COUNT the symbol counter 52 supplying SYMBOL COUNT as row and column addressing respectively in the RAM(s) within the rate buffer 77.

Figure 6:
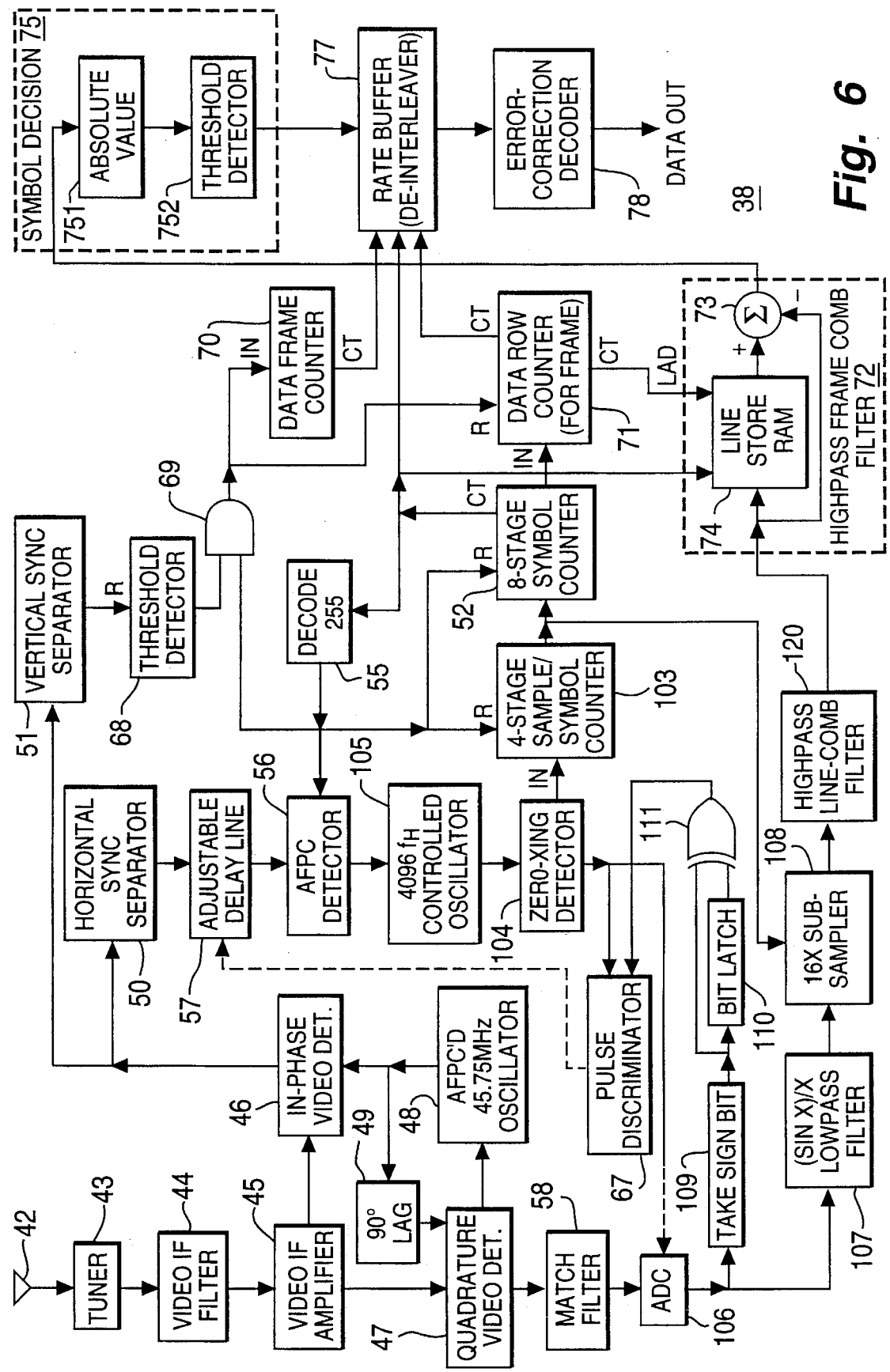

FIG. 6 shows a digital signal receiver 38 that is a modification of the digital signal receiver 37 of FIG. 5 and also is designed to be used with a transmitter 1 using the partial-response filter 160 shown in FIG. 2. As compared to the digital signal receiver 37, there is a reversal of the order of the highpass frame-comb filter 72 and of the highpass line-comb filter 120 in their cascade connection with each other in the digital signal receiver 38.

Figure 7:
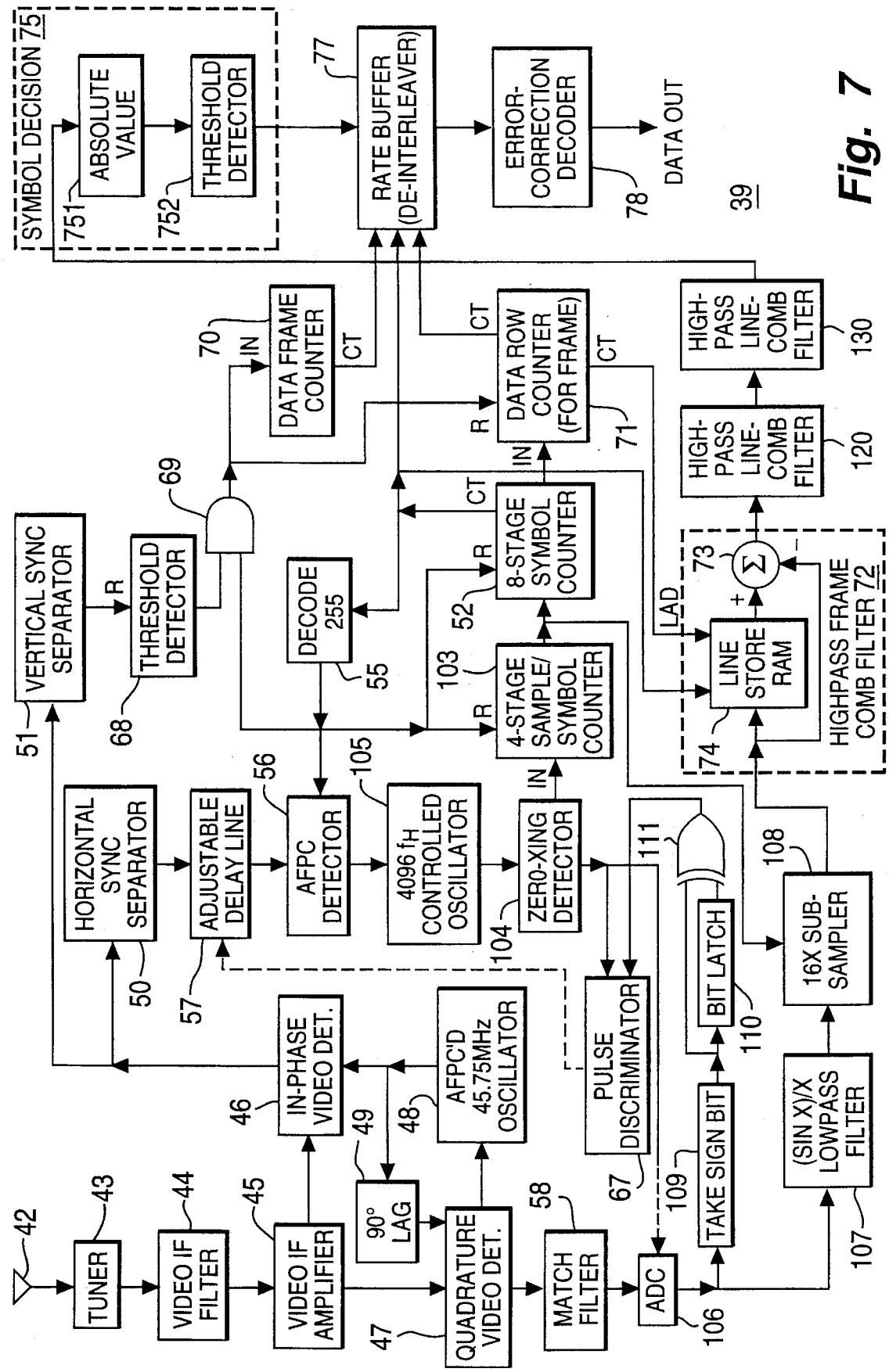

FIG. 7 shows a digital signal receiver 39 that is a modification of the digital signal receiver 37 of FIG. 5 and that is designed to be used with a transmitter 1 using the partial-response filter 166 shown in FIG. 3. In this digital signal receiver 39 the highpass line-comb filter 120 is followed by another highpass line-comb filter 130. This cascade connection of highpass line-comb filters 120 and 130 is the equivalent of using a digital delay line tapped at zero, 1-H and 2-H delay intervals to supply input signals to a weighted summation network, therein to be weighted in (−0.25):0.5:(−0.25) ratio for developing a filter response.

When the partial-response filter in the transmitter is of the sort 166 shown in FIG. 3 or of equivalent sort, and when the digital signal receiver includes a three-scan-line highpass line-comb filter of the sort shown in FIG. 7 or of equivalent sort, the digital response of the highpass frame-comb filter 72 during valid data frames is essentially five-level, rather than ternary in nature, with regard to describing PSK signal. Accordingly, in FIG. 7 the symbol decision circuitry 75 of FIGS. 5 or 6, which has three comparator ranges respectively centered on −1 and 0 and +1, is replaced by symbol decision circuitry 76, which has five comparator ranges centered on −2, −1, 0, +1 and +2. The symbol decision circuitry 76 includes an absolute-value circuit 761, which generates a rectified digital response to the output signal from the highpass frame-comb filter 72. The rectified digital response of the absolute-value circuit 761 is descriptive of ternary coding of keying signal superposed on a direct-voltage pedestal, rather than being descriptive of binary coding of keying signal, so this rectified digital response is supplied to a dual-threshold detector 762. The dual-threshold threshold detector 762 receives the symbol stream from absolute-value circuit 761 and makes a decision as to whether the symbol is most likely a ZERO, is most likely a ONE or is most likely a TWO, TWOs being equated to ZEROs. The dual-threshold threshold detector 762 typically contains two digital comparators each arranged to operate as single-threshold detector, one at a threshold digital value twice as large as the other, and some simple logic circuitry for deciding the identity of the symbol depending on the threshold detection results. If neither threshold digital value is exceeded, the logic circuitry indicates that the symbol is most likely a ZERO. If only the lower threshold digital value is exceeded, the logic circuitry indicates that the symbol is most likely a ONE. If both the lower and higher threshold digital values are exceeded, the logic circuitry indicates that the symbol is most likely a TWO and it is equated to ZERO. The dual-threshold threshold detector 762 is preferably of a type in which the digital values supplied to the comparators for determining the thresholds for threshold detection are automatically adjusted responsive to symbol strength. In such case, the dual-threshold threshold detector 762 has associated circuitry for detecting the average level of the symbol stream supplied by absolute-value circuit 761, or its average peak level, or both. There is circuitry for reckoning from each level detected the digital values supplied to the digital comparators to establish their respective thresholds for threshold detection. The detection procedures for determining symbol decision thresholds preferably are selectively implemented during the vertical blanking interval, when the composite video signal contributes almost no energy to the signal detected by the quadrature-phase video detector 47.

Figure 8:
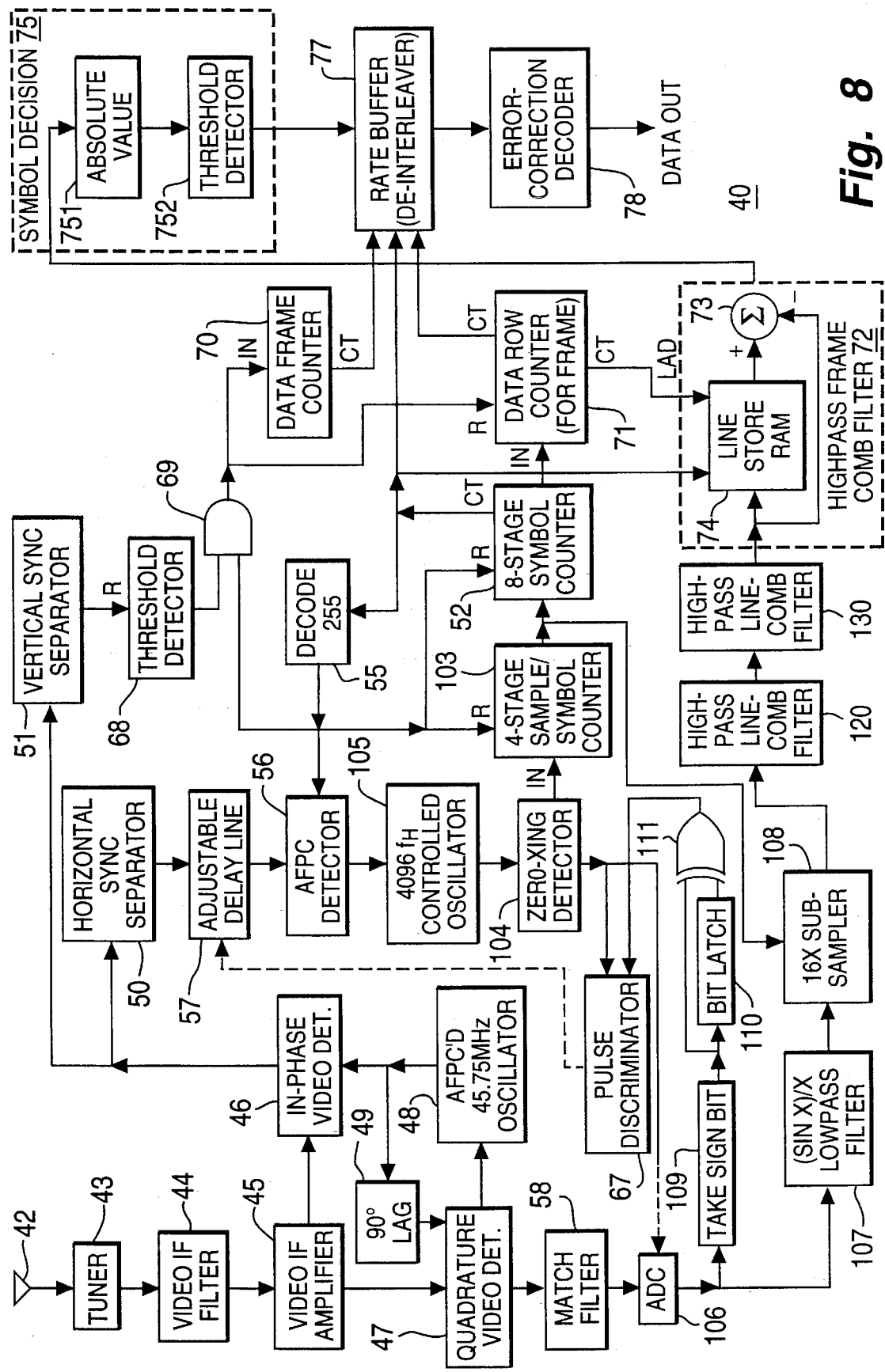
Figure 9:
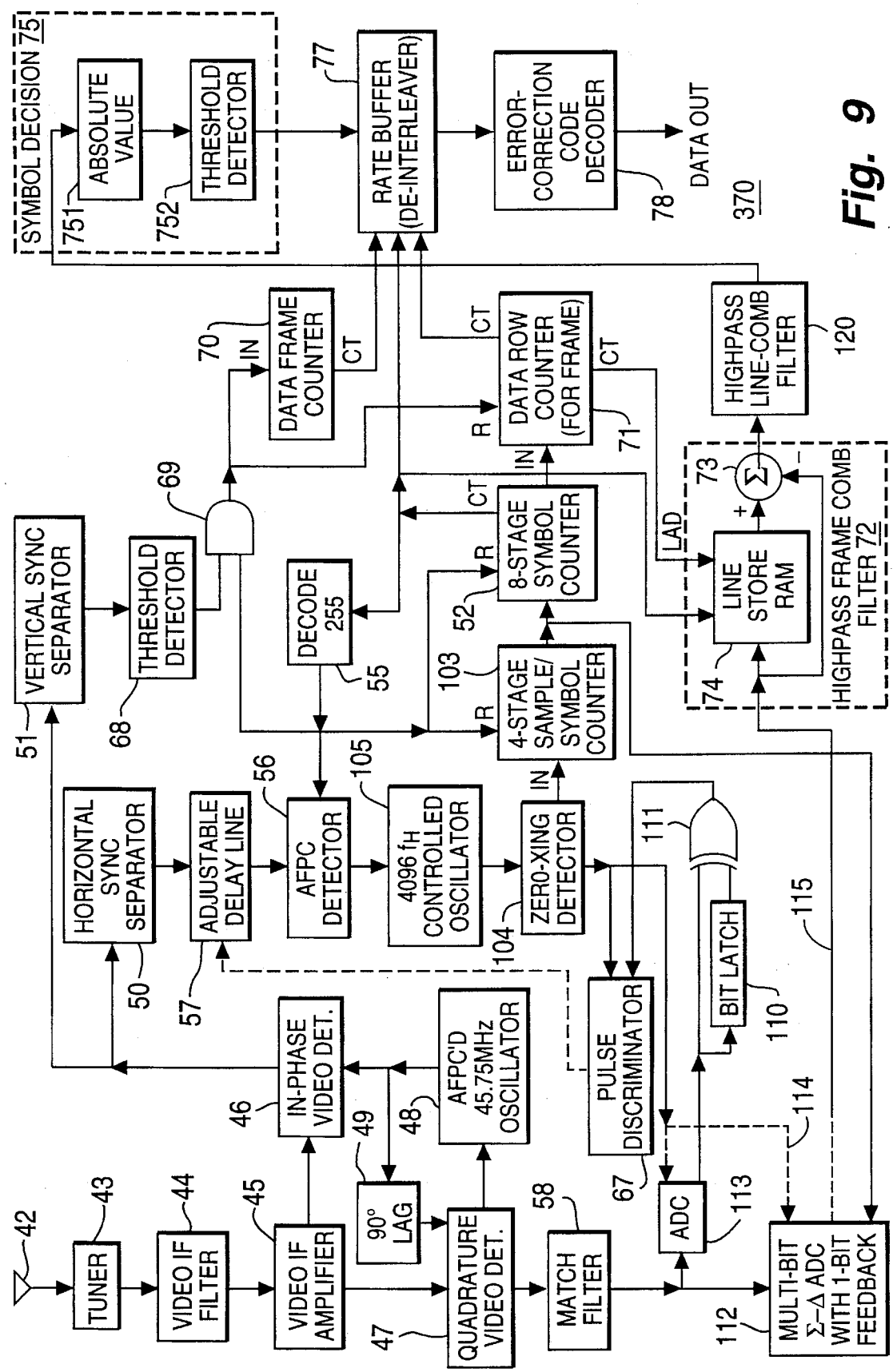
Figure 10:
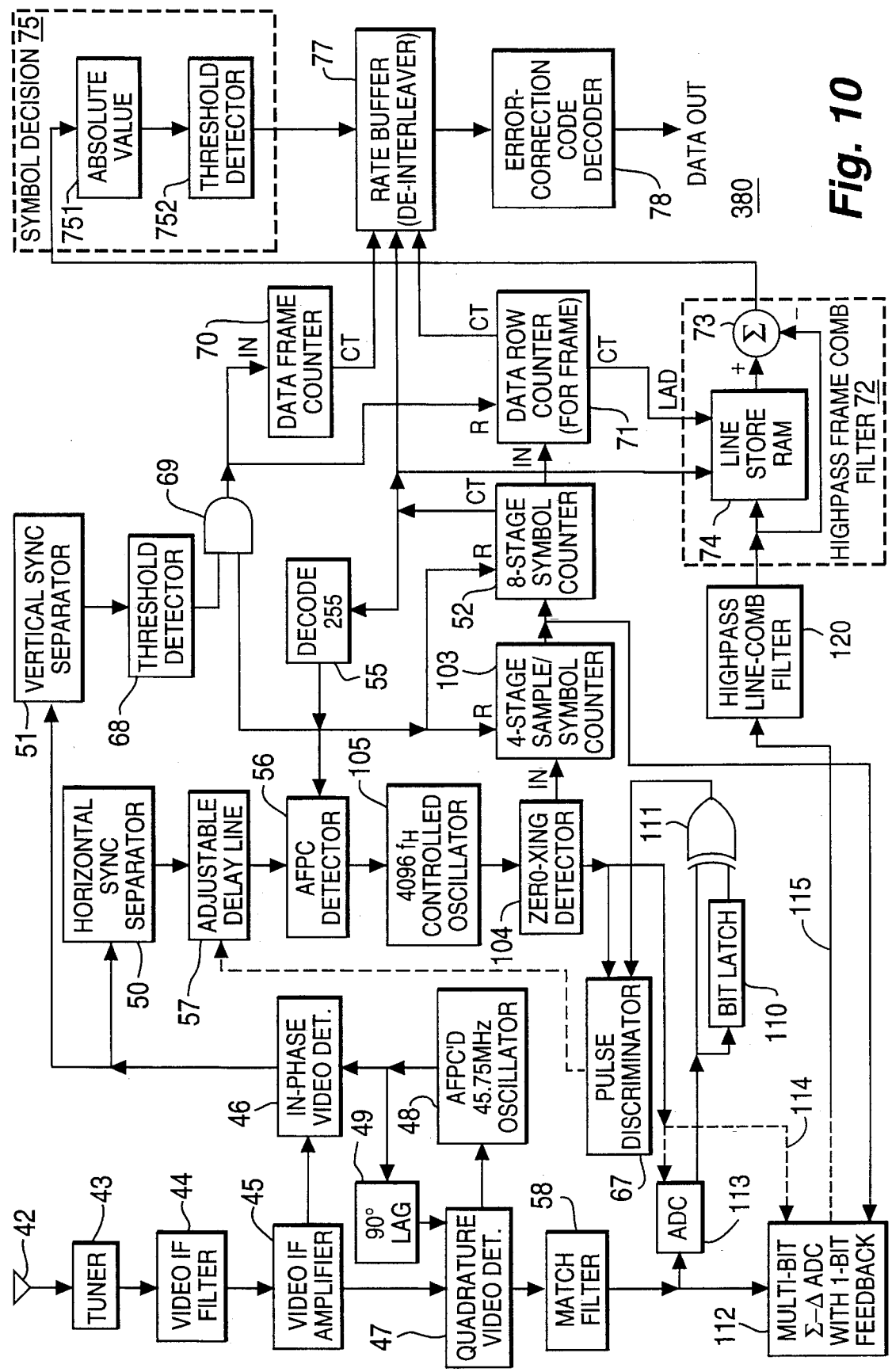
Figure 11:
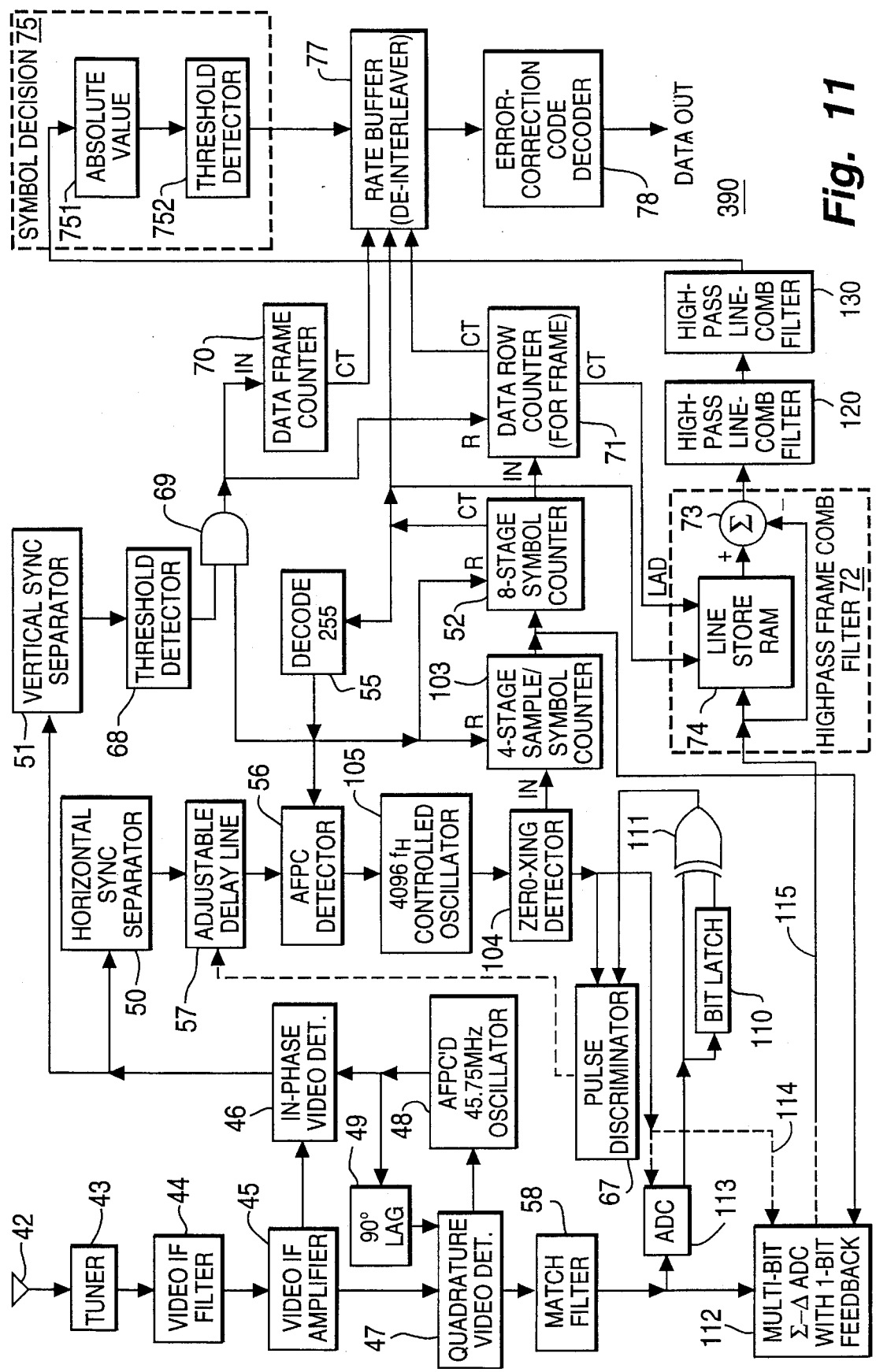
Figure 12:
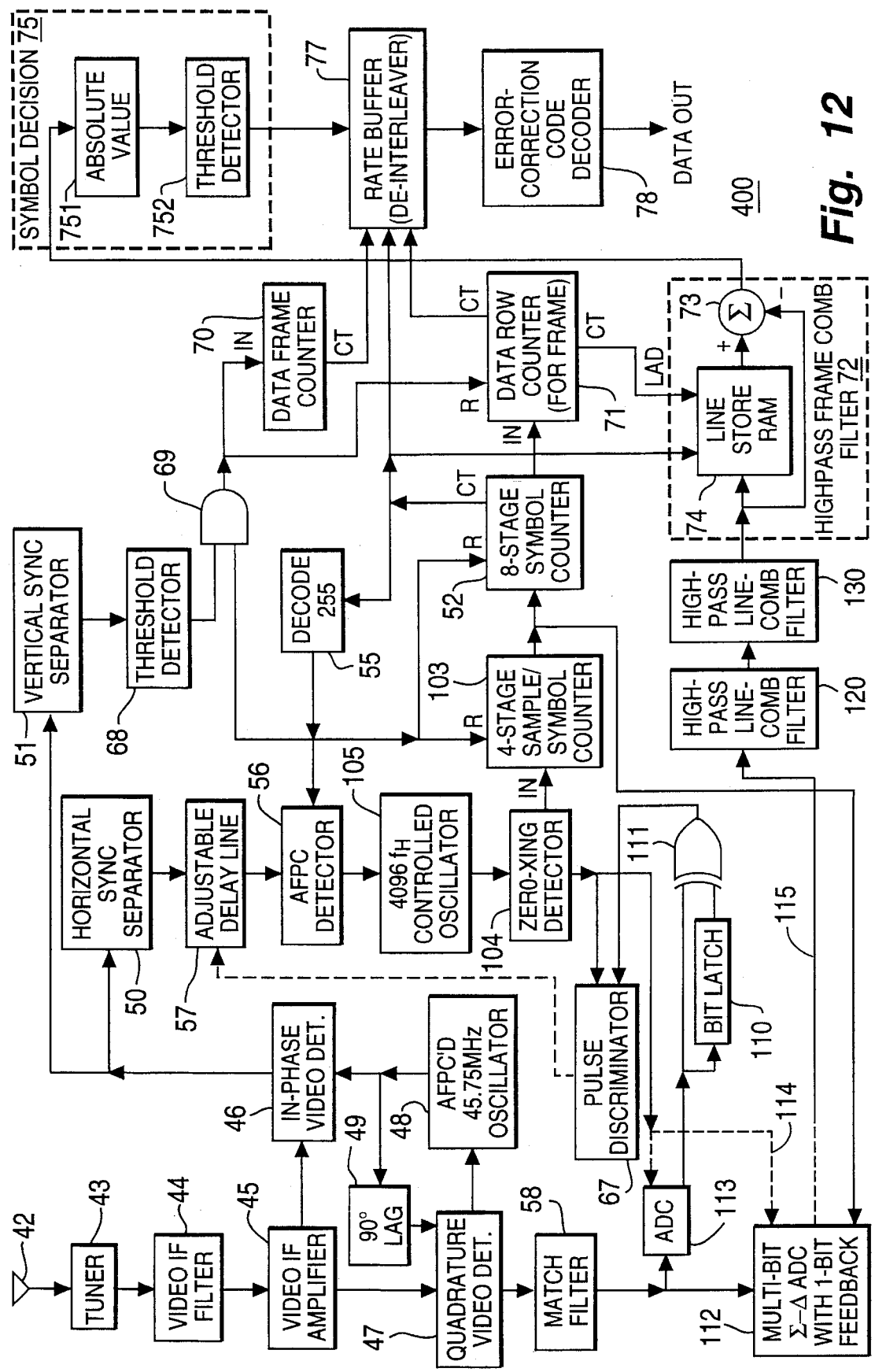

FIG. 8 shows a digital signal receiver 40 that is a modification of the digital signal receiver 39 of FIG. 7 and also is designed to be used with a transmitter 1 using the partial-response filter 166 shown in FIG. 3. In the digital signal receiver 40, the highpass frame-comb filter 72 is placed after the cascade connection of the highpass line-comb filters 120 and 130 with each other, rather than before as in the digital signal receiver 39. An arrangement where the highpass frame-comb filter 72 succeeds the highpass line-comb filter 120, but precedes the highpass line-comb filter 130, is another embodiment of the invention, which is not specifically shown.

FIGS. 9–12 show digital-signal receivers similar to those of FIGS. 5–8, respectively, except for a different type of oversampling analog-to-digital converter being used to digitize the response of the match filter 58 to the signal detected by the quadrature-phase synchronous video detector 47. The elements 106–109 of the digital-signal receivers of FIGS. 5–8 are dispensed with in the digital-signal receivers of FIGS. 9–12 in favor of a sigma-delta analog-to-digital converter 112 and an auxiliary analog-to-digital converter 113 for generating the sign bit that is supplied to the two inputs of the XOR gate 111 directly and as delayed one-sample period by the bit latch 110. The oversampling analog-to-digital converter 112 is capable of digitizing analog signal of either positive or negative polarity and has a sigma-delta architecture of the Leslie and Singh type.

More particularly, the ADC 112 is preferably a multi-bit sigma-delta converter with single-bit feedback, as described by T. C. Leslie and B. Singh in their paper "An Improved Sigma-Delta Modulator Architecture", 1990 IEEE SYMPOSIUM ON CIRCUITS & SYSTEMS, 90 CH 2868-8900000-0372, pp. 372–375. A flash converter with 8-bit resolution (which is of modest price) samples the error signal in a second-order sigma-delta feedback loop, and single-bit feedback is used to minimize digital-to-analog conversion errors. The second-order sigma-delta feedback loop is unconditionally stable. The error signal is sampled at sixteen times the symbol rate of 256 times horizontal scan line rate fH for a 16:1 oversampling ratio, sampling each time a pulse is received over a line 114 from the zero-crossing detector 104 responsive to its detecting the oscillations from the oscillator 105 crossing zero axis in a prescribed direction. The digital output of the flash converter is supplied to an FIR lowpass filter within the converter 112, and the digital response of this filter is subsampled 16:1 by a subsampler sampling each time a pulse is received over a line 115 from the carry overflow of the sample-per-symbol counter 103. This decimation reduces the amount of storage capability required in the delay portions of the digital comb-filtering to follow. Subsampling at symbol rate, with optimal phasing, is a form of synchronous symbol detection which suppresses response to those components of the composite video signal that exhibit change at symbol rate, but are in quadrature phasing with the sampling at symbol rate.

The single-bit ADC 113, sampling at sixteen times the symbol rate of 256 times horizontal scan line rate fH responsive to pulses supplied by the zero-crossing detector 104 on the line 114, responds to the match filter 58 response to supply a sign bit descriptive of the polarity of the match filter 58 response. That sign bit and that sign bit as delayed one sample in the bit latch 110 are supplied as respective inputs to the exclusive-OR gate 111. The XOR gate 111 detects match filter 58 response, supplying the results of this detection to a pulse phase discriminator 67. The pulse phase discriminator 67 selectively detects departures of the zero-crossings of the match filter 58 response, as detected by the XOR gate 111, from proper phasing respective to the zero-crossings of the oscillations of the controlled oscillator 105, as detected by the zero-crossing detector 104. The pulse phase discriminator 67 lowpass filters these selectively detected departures, as sampled and held, thereby to generate a control signal for adjusting the delay the controlled delay line 57 provides for the horizontal sync pulses H applied to the AFPC detector 56. This selective detection by the pulse phase discriminator 67 can be done during portions of the vertical blanking interval when the response of quadrature-phase video detector 47 to composite video signals is expected to be zero-valued. The phasing of the oversampling by the flash converter in the ADC 112 during its digitization of second-order sigma-delta error signal is accordingly adjusted for minimal inter-symbol interference.

The symbol decision circuit 75 in the digital signal receivers 37 and 38 of FIGS. 5, 6, 9 and 10, and the symbol decision circuit 76 in the digital signal receivers 39 and 40 of FIGS. 7, 8, 11 and 12 each make "hard" decisions to supply binary input signal into the decoder 78, for implementing what data communications engineers term "hard-decision" forward error correction. The symbol decision circuits 75 and 76 can be replaced with circuitry that supplies input signals with multiple levels into a suitable decoder, for implementing what data communications engineers term "soft-decision" forward error correction instead, of course.

FIG. 13 shows a form that the rate buffer 20 shown in FIG. 4 can take when it is to be used as an interleaver for modified Reed-Solomon coding furnished from the error-correction coder 14. A data frame pair counter 80 receives as its count input (CI) signal a carry out (CO) signal supplied from the data frame counter 23. The data frame pair counter 80 controls the alternated writing and reading of two data frame-store random access memories 81 and 82 operated as an interleaver for error-correction coding. The RAMs 81 and 82 are written from the error-correction coder 14 at one-half PSK rate during alternate frame pair intervals, the address scanning being by column and by symbols per column. Each of the RAMs 81 and 82 is read to the frame-store memory 21 at PSK rate in each frame pair interval following a frame pair interval in which it is written, the address scanning being by row and by symbols per row. The "symbols" per row referred to here are PSK symbols or bits, not the 2N-bit symbols associated with the modified Reed-Solomon codes considered from a coding standpoint.

An address multiplexer 83 receives DATA ROW COUNT from the data row counter 24 and SYMBOL/ROW COUNT from the symbol (i.e., symbol-per-row) counter 25 as read addressing. The address multiplexer 83 receives DATA COLUMN COUNT from a data column counter 84 and SYMBOL/COLUMN COUNT from a symbol-per-column counter 85 as write addressing. The zero-crossing detector 32 furnishes triggering pulses at PSK rate to a triggered flip-flop 86, which functions as a frequency divider for supplying alternate transitions of its output signal at one-half PSK rate to the symbol-per-column counter 85 as count input (CI). A decoder 87 decodes the SYMBOL/COLUMN COUNT reaching full count (525 assuming symbol per column count starts at zero) to furnish a ONE as count input (CI) signal for the data column counter 84. The decoder 87 output signal is supplied as a first input signal to a two-input OR gate 88, which OR gate 88 responds to a ONE from the decoder 87 to furnish a ONE as reset (R) signal to the symbol-per-column counter 85. The trailing edge of each ONE pulse resets the SYMBOL/COLUMN COUNT to its initial value of one.

The second input signal to the OR gate 88 and the reset (R) signal to the data column counter 84 are furnished by the output response from a 3-input AND gate 89, which response when it is ONE resets both the SYMBOL/COLUMN COUNT and the DATA COLUMN COUNT to their respective initial values. A decoder 260 supplies a logic ONE to a first input of the AND gate 89 when and only when the DATA ROW COUNT indicates that the final row of the data frame is reached; otherwise the decoder 260 supplies a logic ZERO as its output signal to the AND gate 89. (The decoder 260 can be the decoder 27 of FIG. 4 when the partial-response filter 160 is used in the transmitter 1 so the decoder 27 is designed to supply a logic ONE when and only when the DATA ROW COUNT indicates that the final row of the data frame is reached.) The output signal from the final-symbol-of-the-data-row decoder 33 and the MODULO-2 DATA FRAME COUNT from the data frame counter 23 are applied to the AND gate 88 as the other two of its three input signals. The AND gate 88 output response is a ONE only when the final symbol of the final data row is reached in the odd frame, just before the even frame is reached when a selected one of the RAMs 81 and 82 is to be read to the frame-store memory 21 data row by data row.

Modulo-2 DATA FRAME PAIR COUNT from the data frame pair counter 80 being a ONE conditions the address multiplexer 83 to select read addressing to the RAM 81 and to select write addressing to the RAM 82. Modulo-2 DATA FRAME PAIR COUNT from the data frame pair counter 80 being a ONE enables the RAM 81 to be read data row by data row to the frame-store memory 21, and the one's complement of that count being a ZERO enables the RAM 82 to be written data column by data column from the error-correction coder 14.

Modulo-2 DATA FRAME PAIR COUNT from the data frame pair counter 80 being a ZERO conditions the address multiplexer 83 to select read addressing to the RAM 82 and to select write addressing to the RAM 81. Modulo-2 DATA FRAME PAIR COUNT from the data frame pair counter 80 being a ZERO enables the RAM 82 to be read data row by data row to the frame-store memory 21, and the one's complement of that count being a ONE enables the RAM 81 to be written data column by data column from the error-correction coder 14.

FIG. 14 shows a form that the rate buffer 77 shown in any of the FIGS. 5–12 can take when it is to be used as a de-interleaver for modified Reed-Solomon coding furnished from the symbol decision circuitry 75 or 76, A data frame pair counter 90 receives as its count input (CI) signal a carry out (CO) signal supplied from the data frame counter 70. The data frame pair counter 90 controls the alternated writing and reading of two data frame-store random access memories 91 and 92 operated as a de-interleaver for error-correction coding. The RAMs 91 and 92 are written only during alternate even frames, the data for writing the RAMs 91 and 92 being supplied from the symbol decision circuitry 75 or 76 at PSK rate, the address scanning being by row and by symbols per row. The "symbols" per row referred to here are PSK symbols or bits, not the 2N-bit symbols associated with the modified Reed-Solomon codes considered from a coding standpoint. Each of the RAMs 91 and 92 is read to the frame-store memory 21 at one-half PSK rate during alternate frame pair intervals, the address scanning being by column and by symbols per column.

An address multiplexer 93 receives DATA ROW COUNT from the data row counter 71 and SYMBOL/ROW COUNT from the symbol (i.e., symbol-per-row) counter 52 as write addressing. The address multiplexer 93 receives DATA COLUMN COUNT from a data column counter 94 and SYMBOL/COLUMN COUNT from a symbol-per-column counter 95 as read addressing. The zero-crossing detector 104 furnishes triggering pulses at PSK rate to a triggered flip-flop 96, which functions as a frequency divider for supplying alternate transitions of its output signal at one-half PSK rate to the symbol-per-column counter 95 as count input (CI). A decoder 97 decodes the SYMBOL/COLUMN COUNT reaching full count (525 assuming symbol per column count starts at zero) to furnish a ONE as count input (CI) signal for the data column counter 94. The decoder 97 output signal is supplied as a first input signal to a two-input OR gate 98, which OR gate 98 responds to a ONE from the decoder 97 to furnish a ONE as reset (R) signal to the symbol-per-column counter 95. The trailing edge of each ONE pulse resets the SYMBOL/COLUMN COUNT to its initial value of one.

The second input signal to the OR gate 98 and the reset (R) signal to the data column counter 94 are furnished by the output response from a 3-input AND gate 99, which response when it is ONE resets both the SYMBOL/COLUMN COUNT and the DATA COLUMN COUNT to their respective initial values. The decoder 61 supplies a logic ONE to a first input of the AND gate 99 when and only when the DATA ROW COUNT indicates that the final row of the data frame is reached; otherwise the decoder 61 supplies a logic ZERO as its output signal to the AND gate 99. The output signal from the final-symbol-of-the-data-row decoder 55 and the MODULO-2 DATA FRAME COUNT from the data frame counter 70 are applied to the AND gate 98 as the other two of its three input signals. The AND gate 98 output response is a ONE only when the final symbol of the final data row is reached in the odd frame, just before the even frame is reached when a selected one of the RAMs 91 and 92 is to be written data row by data row from the symbol decision circuitry 75 or 76.

Modulo-2 DATA FRAME PAIR COUNT from the data frame pair counter 90 being a ONE conditions the address multiplexer 93 to select read addressing to the RAM 91 and to select write addressing to the RAM 92. DATA FRAME PAIR COUNT from the data frame pair counter 90 being a ONE enables the RAM 91 to be read data column by data column to the error-correction decoder 78. A two-input AND gate 101 selectively supplies a ONE as write enable (WE) signal to the RAM 91, responsive to the one's complements of the DATA FRAME COUNT and the DATA FRAME PAIR COUNT from the counters 70 and 90 both being ZEROs. This WE signal enables the RAM 91 to be written data row by data row from the symbol decision circuitry 75 or 76.

Modulo-2 DATA FRAME PAIR COUNT from the data frame pair counter 90 being a ZERO conditions the address multiplexer 93 to select read addressing to the RAM 92 and to select write addressing to the RAM 91. DATA FRAME PAIR COUNT from the data frame pair counter 90 being a ZERO enables the RAM 92 to be read data column by data column to the error-correction decoder 78. A two-input AND gate 102 selectively supplies a ONE as write enable (WE) signal to the RAM 92, responsive to the one's complement of the DATA FRAME COUNT being a ZERO and the DATA FRAME PAIR COUNT from the counter 90 being a ONE. This WE signal enables the RAM 92 to be written data row by data row from the symbol decision circuitry 75 or 76.

The rate buffering, done in the digital signal receivers 37-40 so as to fill the gap left when alternate frames of non-valid signal arising from the frame-comb filtering of paired frames are discarded, can take place after the frame-comb filtering, but before the symbol decision circuitry. Rate buffering is preferably done after symbol decision, however, since then the frame-store memory need only be one-bit deep, rather than many bits deep. Doing rate buffering together with de-interleaving before error-correction decoding is preferable, since it avoids the need for a separate frame-store memory for rate buffering. Where rate buffering is done separately from de-interleaving, the rate buffering can be done with just one frame-store memory, if it is a dual-ported RAM having a read-only port supplied by a shift register the serial stages of which can be loaded in parallel a row at a time from the RAM portion accessed through a read/write port.

FIG. 15 shows a single-loop sigma-delta converter 200 of the general type described by Leslie and Singh, which converter can be used in any of the digital-signal receivers of FIGS. 5-8. The sigma-delta converter 200 is constructed using a flash converter 201 with 8-bit resolution as the basic converter. There is a wired taking 202 of the most significant bit (i.e., the sign bit) of the digital output signal of the flash converter 201 for application to a bit latch 203 as a digital feedback signal. The contents of the bit latch 203 are converted to positive or negative analog voltage levels by a digital-to-analog converter 204, thereby to generate an analog feedback signal. An analog subtractor 205 subtracts this analog feedback signal from the input signal supplied to the input terminal 206 of the sigma-delta converter 200 and sampled to the subtractor 205 by a sampling switch (or sampler) 207. The difference output signal from the subtractor 205 is an analog error signal. An analog adder 208 adds its own sum output signal, as delayed for a sample time by a sample-and-hold circuit 209, to the analog error signal, thereby to generate the sum output signal from the analog adder 208. The sum output signal from the analog adder 208 is a single integration with respect to time of the analog error signal, which integrated response is digitized by the flash converter 201. The digital-to-analog converter 204, the analog subtractor 205, the sampler 207, the analog adder 208 and the sample-and-hold circuit 209 are advantageously constructed in switched-capacitor circuitry.

The errors generated by the use of single-bit feedback are compensated for in a way suggested by Leslie and Singh. The wired taking 202 of the most significant bit (i.e., the sign bit) of the digital output signal of the flash converter 201 is accompanied by a wired ZERO-extension 213 through the less significant bit places to generate an 8-bit subtrahend for a digital subtractor 214 receiving as its minuend input signal the complete 8-bit digital output signal of the flash converter 201. The difference output signal from the subtractor 214 as delayed a sample time in a parallel battery 215 of eight bit latches is added in a digital adder 218 to generate 9-bit sum signals supplied to a lowpass accumulation filter 219. The response of the accumulation filter 219 is subsampled at symbol rate by a subsampler 220 to an output terminal 221 of the sigma-delta converter 200.

FIG. 16 shows a dual-loop sigma-delta converter 300 of the general type described by Leslie and Singh, which converter can be used in any of the digital-signal receivers of FIGS. 5-8 and includes a flash converter 301 with 8-bit resolution as its basic converter. There is a wired taking 302 of the most significant bit (i.e., the sign bit) of the digital output signal of the flash converter 301 for application to a bit latch 303 as a digital feedback signal. The contents of the bit latch 303 are converted to positive or negative analog voltage levels by a digital-to-analog converter 304, thereby to generate an analog feedback signal. An analog subtractor 305 subtracts this analog feedback signal from the input signal supplied to the input terminal 306 of the sigma-delta converter 300 and sampled to the subtractor 305 by a sampling switch (or sampler) 307. The difference output signal from the subtractor 305 is an analog error signal. An analog adder 308 adds its own sum output signal, as delayed for a sample time by a sample-and-hold circuit 309, to the analog error signal, thereby to generate the sum output signal from the analog adder 308. The sum output signal from the analog adder 308 is a single integration with respect to time of the analog error signal, which singly integrated response is supplied as minuend signal to an analog subtractor 310 that receives the analog feedback signal as a subtrahend signal. An analog adder 311 adds its own sum output signal, as delayed for a sample time by a sample-and-hold circuit 312, to the integrated analog error signal, thereby to generate the sum output signal from the analog adder 311. The sum output signal from the analog adder 311 is a double integration with respect to time of the analog error signal, which doubly integrated response is digitized by the flash converter 301. The digital-to-analog converter 304, the analog subtractors 305 and 310, the sampler 307, the analog adders 308 and 311, and the sample-and-hold circuits 309 and 312 are advantageously constructed in switched-capacitor circuitry.

The errors generated by the use of single-bit feedback are compensated for in a way suggested by Leslie and Singh. The wired taking 302 of the most significant bit (i.e., the sign bit) of the digital output signal of the flash converter 301 is accompanied by a wired ZERO-extension 313 through the less significant bit places to generate an 8-bit subtrahend for a digital subtractor 314 receiving as its minuend input signal the complete 8-bit digital output signal of the flash converter 301. The difference output signal from the subtractor 314 is delayed for one sample time in a parallel battery 315 of eight bit latches and is further delayed for one more sample time in a parallel battery 316 of eight bit latches. The digital output signal of the flash converter 301, the contents of the parallel battery 315 of eight bit latches as doubled by a wired single-bit-place shift 317, and the contents of the parallel battery 316 of eight bit latches are added together by a digital adder 318 to generate 10-bit sum signals supplied to a lowpass accumulation filter 319. The response of the accumulation filter 319 is subsampled at symbol rate by a subsampler 320 to an output terminal 321 of the sigma-delta converter 300.

FIG. 17 shows in detail one form 121 that the highpass line-comb filter 120 can take. An input terminal 122 for the filter 121 connects to the minuend input connection of a subtractor 123 having its output connection connected to an output terminal 124 of the filter 121. The subtrahend input connection of the subtractor 123 receives from the output connection of a clocked digital delay line 125 a delayed response to the output signal from a multiplexer 126, which multiplexer 126 output signal is applied to the input connection of the delay line 125. The delay line 125 provides delay equal to the duration of one horizontal scan line for its several-bits-wide response.

The multiplexer 126 receives control signal from a decoder 61, which responds with a ONE to the DATA ROW COUNT from the data row counter 71 reaching the value associated with the final row of data in a data frame and that responds with a ZERO to all other values of DATA ROW COUNT. Responsive to the decoder 61 output signal being a ONE, the multiplexer 126 selects arithmetic zero for its output response. Responsive to the decoder 61 output signal being a ZERO, the multiplexer 126 selects the digitized detected BPSK signal supplied to the input terminal 122 for application to the input connection of the 1-H delay line 125.

FIG. 18 shows in detail another form 127 that the highpass line-comb filter 120 can take, which is alternative to the form shown in FIG. 17 and does not include elements 125 and 126. The output connection of a multiplexer 128 connects to the subtrahend input of the subtractor 123 in FIG. 18. The multiplexer 128 receives control signal from a decoder 62, which responds with a ONE to the DATA ROW COUNT from the data row counter 71 being reset to the value associated with the initial row of data in a data frame and that responds with a ZERO to all other values of DATA ROW COUNT. Responsive to the decoder 62 output signal being a ONE, the multiplexer 128 selects arithmetic zero for its output response. Responsive to the decoder 61 output signal being a ZERO, the multiplexer 128 selects the output signal from a 1-H digital delay line 129 for application to the subtrahend input connection of the subtractor 123. The output signal from the 1-H digital delay line 129 is a delayed response to the digitized detected BPSK signal supplied to the input terminal 122 of the filter 120, the delay being equal to the duration of one horizontal scan line.

FIG. 19 shows in detail one form that the cascade connection of the highpass line-comb filters 120 and 130 can take. The highpass line-comb filter 121 is the same as in FIG. 17; and a highpass line-comb filter 131 in FIG. 19 has elements 132–136 which correspond to the elements 122–126 of the highpass line-comb filter 121 and are similarly connected within the confines of each filter.

FIG. 20 shows in detail another form that the cascade connection of the highpass line-comb filters 120 and 130 can take. The highpass line-comb filter 127 is the same as in FIG. 18; and a highpass line-comb filter 137 in FIG. 20 has elements 138 and 139 which correspond to the elements 128 and 129 of the highpass line-comb filter 127 and are similarly connected within the confines of each filter.

The data transmission schemes described in this specification provide for a single, reasonably-wideband data transmission channel. A variety of different services can be provided via this single data transmission channel using time-division-multiplex schemes of various types. For example, data can be transmitted in packets with each successive packet being provided header information for indicating the nature of the data service provided and the originator of the data service. The television broadcasters and the cablecaster can be originators of various data services. In two-way data transmission schemes the packet heading identifying the originator can be used for selecting the proper data return channel, such as a telephone link or a dedicated channel in a cablecast system.

The analog-to-digital conversion arrangements described above are also useful in other arrangements for burying digital modulation in an NTSC signal, particularly those using digital comb-filtering for suppressing the interfering NTSC signal prior to the symbol decision circuitry. If the data modulation is any species of amplitude modulation, and if the symbol rate is chosen correctly (preferably to be a multiple of half scan line frequency) digital comb-filtering prior to the symbol decision circuitry is generally useful for suppressing interfering portions NTSC signal or remnants of such signal, no matter what the frequency and phase of the carrier for the digital signal. This is more particularly described Jian Yang et alii in U.S. patent application Ser. No. 08/363,239 filed Dec. 23, 1994, entitled RECEIVERS FOR DIGITAL SIGNALS BURIED WITHIN NTSC TELEVI- SION SIGNALS, incorporated herein as non-essential subject matter, and assigned to Samsung Electronics Co., Ltd., pursuant to pre-existing employee agreements so to assign inventions made within the scope of employment. The analog-to-digital converter of the input signal for the digital comb-filtering must have large enough dynamic range for input signal that the buried digital signal is not lost to over-ranging on large excursions of NTSC composite video signal or remnants thereof, and the analog-to-digital converter must also have sufficient bit resolution that the buried digital signal is not lost to quantizing noise.

Perhaps the most severe requirements on the analog-to-digital converter occur when the buried digital signal modulates the amplitude of a suppressed carrier of the same frequency and phase as the video carrier, since synchronous detection procedures are of no avail in suppressing portions of the NTSC composite video signal when recovering the digital signal such as a BPSK signal. Symbol-comb, line-comb and frame-comb filtering can all be employed singly or in combination to reduce the effects of the interfering NTSC composite video signal prior to the symbol decision circuitry; and partial-response filtering is used to compensate for the effects of the symbol-comb or line-comb filtering.

In U.S. patent application Ser. No. 08/179,588 filed Jan. 5, 1994, entitled APPARATUS FOR PROCESSING BPSK SIGNALS TRANSMITTED WITH NTSC TV ON QUADRATURE-PHASE VIDEO CARRIER and assigned to Samsung Electronics Co., Ltd., pursuant to pre-existing employee agreements so to assign inventions made within the scope of employment, Jian Yang et alii describe partial-response filtering that is located after the symbol decision circuitry in the digital signal receiver, rather than being located at the transmitter. Relocation of the partial-response filtering to the digital signal receiver permits it to be adapted to the particular comb filtering arrangements used to reduce NTSC interference before the symbol decision circuitry in a particular digital signal receiver, facilitating the use of adaptive comb filters. The analog-to-digital conversion circuitry requirements are substantially unaffected by relocation of the partial-response filtering to the digital signal receiver.

The embodiments of the invention preferred by the inventors have been described, but one skilled in the art of communications systems, transmitter and receiver design will be enabled by acquaintance with the foregoing disclosure to design a number of alternative embodiments of the invention; and this should be borne in mind when construing the scope of the claims which follow this specification.

What is claimed is:

1. A digital signal receiver for use with a system which, in a combined transmission with a video carrier wave the amplitude of which is modulated in accordance with a composite video signal, serially transmits digital symbols in amplitude modulation sidebands of a suppressed carrier wave, said digital signal receiver comprising:

detection apparatus for responding to said combined transmission to supply a detector response, detecting the amplitude modulation of said suppressed carrier wave, thereby to generate a desired detector response, as accompanied by undesired detector response composed of at least remnants of the composite video signal detected from the amplitude-modulated video carrier wave;

an analog-to-digital converter for digitizing said detector response; and a comb filter receptive of said digitized detector response for generating a response primarily dependent on said desired detector response rather than on said undesired detector response.

2. The digital signal receiver as set forth in claim 1, wherein said amplitude modulation sidebands are phase-shift keying modulation sidebands.

3. The digital signal receiver as set forth in claim 2, wherein said amplitude modulation sidebands are binary phase-shift keying modulation sidebands.

4. The digital signal receiver as set forth in claim 3, wherein said suppressed carrier wave and said video carrier wave are the same in frequency and have a predetermined phase relationship.

5. The digital signal receiver as set forth in any one of claims 1–4, wherein said comb filter is a highpass digital frame-comb filter.

6. The digital signal receiver as set forth in any one of claims 1–4, wherein said analog-to-digital converter is of an oversampling type.

7. The digital signal receiver as set forth in claim 6, wherein said analog-to-digital converter is of sigma-delta type.

8. A digital signal receiver for use with a system which, in a combined transmission with a video carrier wave the amplitude of which is modulated in accordance with a composite video signal, serially transmits digital symbols in binary phase-shift keying modulation sidebands of a suppressed carrier wave in quadrature phasing with said video carrier wave, said digital signal receiver comprising:

detection apparatus for responding to said combined transmission to supply a detector response, detecting the binary phase-shift-keying of said suppressed carrier wave thereby to generate a desired detector response, as accompanied by undesired detector response composed of remnants of the composite video signal detected from the amplitude-modulated video carrier wave;

an analog-to-digital converter for digitizing said detector response; and a comb filter receptive of said digitized detector response for generating a response primarily dependent on said desired detector response rather than on said undesired detector response.

9. The digital signal receiver as set forth in claim 8, wherein said comb filter is a highpass digital frame-comb filter.

10. The digital signal receiver as set forth in claim 9, wherein said analog-to-digital converter is of an oversampling type.

11. The digital signal receiver as set forth in claim 9, wherein said analog-to-digital converter is of sigma-delta type.

12. The digital signal receiver as set forth in claim 11, wherein said analog-to-digital converter of sigma-delta type comprises:

an analog subtractor having a minuend input connection for receiving said analog detector response, having a subtrahend input connection for receiving an analog feedback signal, and having an output connection for supplying an analog error signal proportional to the difference between said detector response and said analog feedback signal;

means for integrating said analog error signal at least once respective to time;

a flash converter for converting said analog error signal after having been integrated at least once respective to time, to digital samples with multiple-bit resolution;

a digital-to-analog converter receiving the most significant bit of each of said digital samples as a digital feedback signal and converting it to said analog feedback signal;

means for correcting said digital samples to compensate for said digital feedback signal being only single-bit, thereby to generate corrected digital samples; and means for performing weighted accumulations of said corrected digital samples over prescribed subsampling periods to generate samples of digitized detector response.

13. The digital signal receiver as set forth in claim 8, wherein said comb filter is a highpass digital line-comb filter.

14. The digital signal receiver as set forth in claim 13, wherein said analog-to-digital converter is of an oversampling type.

15. The digital signal receiver as set forth in claim 13, wherein said analog-to-digital converter is of sigma-delta type.

16. The digital signal receiver as set forth in claim 15, wherein said analog-to-digital converter of sigma-delta type comprises:

an analog subtractor having a minuend input connection for receiving said analog detector response, having a subtrahend input connection for receiving an analog feedback signal, and having an output connection for supplying an analog error signal proportional to the difference between said detector response and said analog feedback signal;

means for integrating said analog error signal at least once respective to time;

a flash converter for converting said analog error signal after having been integrated at least once respective to time, to digital samples with multiple-bit resolution;

a digital-to-analog converter receiving the most significant bit of each of said digital samples as a digital feedback signal and converting it to said analog feedback signal;

means for correcting said digital samples to compensate for said digital feedback signal being only single-bit, thereby to generate corrected digital samples; and means for performing weighted accumulations of said corrected digital samples over prescribed subsampling periods to generate samples of digitized detector response.

17. The digital signal receiver as set forth in claim 8, wherein said comb filter is a highpass digital frame-comb filter followed in cascade by a highpass digital line-comb filter.

18. The digital signal receiver as set forth in claim 17, wherein said analog-to-digital converter is of an oversampling type.

19. The digital signal receiver as set forth in claim 18, wherein said analog-to-digital converter is of sigma-delta type.

20. The digital signal receiver as set forth in claim 19, wherein said analog-to-digital converter of sigma-delta type comprises:

an analog subtractor having a minuend input connection for receiving said analog detector response, having a subtrahend input connection for receiving an analog feedback signal, and having an output connection for supplying an analog error signal proportional to the difference between said detector response and said analog feedback signal;

means for integrating said analog error signal at least once respective to time;

a flash converter for convening said analog error signal after having been integrated at least once respective to time, to digital samples with multiple-bit resolution;

a digital-to-analog converter receiving the most significant bit of each of said digital samples as a digital feedback signal and convening it to said analog feedback signal;

means for correcting said digital samples to compensate for said digital feedback signal being only single-bit, thereby to generate corrected digital samples; and means for performing weighted accumulations of said corrected digital samples over prescribed subsampling periods to generate samples of digitized detector response.

21. The digital signal receiver as set forth in claim 17, further comprising:

symbol decision circuitry for receiving a response from said combined comb filter response and for deciding the identity of each digital symbol to generate a bit-serial digital signal response.

22. The digital signal receiver as set forth in claim 21, wherein said analog-to-digital converter is of sigma-delta type.

23. The digital signal receiver as set forth in claim 22, wherein said analog-to-digital converter of sigma-delta type comprises:

an analog subtractor having a minuend input connection for receiving said analog detector response, having a subtrahend input connection for receiving an analog feedback signal, and having an output connection for supplying an analog error signal proportional to the difference between said detector response and said analog feedback signal;

means for integrating said analog error signal at least once respective to time;

a flash converter for converting said analog error signal after having been integrated at least once respective to time, to digital samples with multiple-bit resolution;

a digital-to-analog converter receiving the most significant bit of each of said digital samples as a digital feedback signal and convening it to said analog feedback signal;

means for correcting said digital samples to compensate for said digital feedback signal being only single-bit, thereby to generate corrected digital samples; and means for performing weighted accumulations of said corrected digital samples over prescribed subsampling periods to generate samples of digitized detector response.

24. The digital signal receiver as set forth in claim 8, wherein said comb filter is a highpass digital line-comb filter followed in cascade by a highpass digital frame-comb filter.

25. The digital signal receiver as set forth in claim 24, wherein said analog-to-digital converter is of an oversampling type.

26. The digital signal receiver as set forth in claim 24, wherein said analog-to-digital converter is of sigma-delta type.

27. The digital signal receiver as set forth in claim 26, wherein said analog-to-digital converter of sigma-delta type comprises:

an analog subtractor having a minuend input connection for receiving said analog detector response, having a subtrahend input connection for receiving an analog feedback signal, and having an output connection for supplying an analog error signal proportional to the difference between said detector response and said analog feedback signal;

means for integrating said analog error signal at least once respective to time;

a flash converter for converting said analog error signal after having been integrated at least once respective to time, to digital samples with multiple-bit resolution;

a digital-to-analog converter receiving the most significant bit of each of said digital samples as a digital feedback signal and converting it to said analog feedback signal;

means for correcting said digital samples to compensate for said digital feedback signal being only single-bit, thereby to generate corrected digital samples; and means for performing weighted accumulations of said corrected digital samples over prescribed subsampling periods to generate samples of digitized detector response.

28. The digital signal receiver as set forth in claim 24, further comprising:

symbol decision circuitry for receiving a response from said combined comb filter response and for deciding the identity of each digital symbol to generate a bit-serial digital signal response.

29. A digital signal receiver as set forth in claim 28, wherein said analog-to-digital converter is of sigma-delta type.

30. The digital signal receiver as set forth in claim 29, wherein said analog-to-digital converter of sigma-delta type comprises:

an analog subtractor having a minuend input connection for receiving said analog detector response, having a subtrahend input connection for receiving an analog feedback signal, and having an output connection for supplying an analog error signal proportional to the difference between said detector response and said analog feedback signal;

means for integrating said analog error signal at least once respective to time;

a flash converter for convening said analog error signal after having been integrated at least once respective to time, to digital samples with multiple-bit resolution;

a digital-to-analog converter receiving the most significant bit of each of said digital samples as a digital feedback signal and converting it to said analog feedback signal;

means for correcting said digital samples to compensate for said digital feedback signal being only single-bit, thereby to generate corrected digital samples; and means for performing weighted accumulations of said corrected digital samples over prescribed subsampling periods to generate samples of digitized detector response.

31. A digital signal receiver for use with a system which, in a combined transmission with a video carrier wave the amplitude of which is modulated in accordance with a composite video signal, serially transmits digital symbols in binary phase-shift keying modulation sidebands of a suppressed carrier wave in quadrature phasing with said video carrier wave, said digital signal receiver comprising:

detection apparatus for responding to said combined transmission to supply a detector response, detecting the binary phase-shift keying of said suppressed carrier wave thereby to generate a desired detector response, as accompanied by undesired detector response composed of remnants of the composite video signal detected from the amplitude-modulated video carrier wave;

an analog-to-digital converter for oversampling said detector response and digitizing the resulting samples to generate an oversampled digitized detector response having a given number of bits resolution for each of the resulting samples so digitized;

a digital lowpass filter receiving said oversampled digitized detector response and generating a digital lowpass filter response;

a subsampler for decimating said digital lowpass filter response, thereby to generate a subsampler response that is a relatively-sparsely-sampled digitized detector response, each sample of which subsampler response has a greater number of bits resolution than said given number of bits resolution, said subsampler response including relatively-sparsely-sampled digitized desired detector response originating from said desired detector response and relatively-sparsely-sampled digitized undesired detector response originating from said desired detector response;

a cascade connection of a highpass digital line-comb filter and a highpass digital frame-comb filter connected for receiving said subsampler response and for selecting against said undesired relatively-sparsely-sampled digitized detector response in a combined comb filter response supplied from said cascade connection, said combined comb filter response having at least one level of response to each digital symbol therein, said digital symbols being descriptive of said relatively-sparsely-sampled digitized desired detector response; and symbol decision circuitry responsive to said combined comb filter response for deciding the identity of each digital symbol to generate a bit-serial digital signal response.

32. The digital signal receiver as set forth in claim 31, wherein said highpass digital frame-comb filter precedes said highpass digital line-comb filter in their said cascade connection and comprises:

an input connection of said highpass digital frame-comb filter for receiving said subsampler response;

an output connection of said highpass digital frame-comb filter for supplying highpass digital frame-comb filter response to said highpass digital line-comb filter as its input signal;

a one-frame digital delay line for delaying said subsampler response as received at the input connection of said highpass digital frame-comb filter by a time interval equal to the duration of a frame scan of said composite video signal; and a first digital subtractor having a first input connection for receiving the delayed response from said one-frame digital delay line, having a second input connection connected without substantial delay from the input connection of said highpass digital frame-comb filter, and having an output connection for supplying differential response to signals at the first and second input connections of said first digital subtractor to the output connection of said highpass digital frame-comb filter.

33. The digital signal receiver as set forth in claim 32, wherein said one-frame delay line is a random access memory operated in a read-then-write-over mode.

34. The digital signal receiver as set forth in claim 32, wherein said highpass digital line-comb filter comprises:

an input connection of said highpass digital line-comb filter for receiving said highpass digital frame-comb filter response;

an output connection of said highpass digital line-comb filter for supplying said combined comb filter response;

a 1-H digital delay line for delaying said highpass digital frame-comb filter response, as received at the input connection of said highpass digital line-comb filter by a time interval equal to the duration of a horizontal scan line of said composite video signal; and a second digital subtractor having a first input connection for receiving the delayed response from said 1-H digital delay line, having a second input connection connected without substantial delay from the input connection of said highpass digital line-comb filter, and having an output connection for supplying differential response to signals at the first and second input connections of said second digital subtractor to the output connection of said highpass digital line-comb filter.

35. The digital signal receiver as set forth in claim 34, wherein said symbol decision circuitry comprises:

an absolute-value circuit having an input connection for receiving said combined comb filter response and having an output connection for supplying a rectified response; and a threshold detector having an input connection for receiving said rectified response from the output connection of said absolute-value circuit and having an output connection for supplying bits of a digital signal, each bit being in a first state when said rectified response exceeds a threshold level and being in a second state when said rectified response does not exceed said threshold level.

36. The digital signal receiver as set forth in claim 32, wherein said highpass digital line-comb filter comprises:

an input connection of said highpass digital line-comb filter for receiving said highpass digital frame-comb filter response;

an output connection of said highpass digital line-comb filter for supplying said combined comb filter response;

a first 1-H digital delay line for delaying said highpass digital frame-comb filter response, as received at the input connection of said highpass digital line-comb filter by a time interval equal to the duration of a horizontal scan line of said composite video signal;

a second digital subtractor having a first input connection for receiving the delayed response from said first 1-H digital delay line, having a second input connection connected without substantial delay from the input connection of said highpass digital line-comb filter, and having an output connection for supplying differential response to signals at the first and second input connections of said second digital subtractor;

a second 1-H digital delay line for delaying the differential response of said second digital subtractor by a time interval equal to the duration 1-H; and a third digital subtractor having a first input connection for receiving the delayed response from said second 1-H digital delay line, having a second input connection connected without substantial delay from the output connection of said third digital subtractor, and having an output connection for supplying differential response to signals at the first and second input connections of said third digital subtractor to the output connection of said highpass digital line-comb filter.

37. The digital signal receiver as set forth in claim 36, wherein said symbol decision circuitry comprises:

an absolute-value circuit having an input connection for receiving said combined comb filter response and having an output connection for supplying a rectified response; and a dual-threshold detector having an input connection for receiving said rectified response from the output connection of said absolute-value circuit and having an output connection for supplying bits of a digital signal, each bit being in a first state when said rectified response exceeds a first threshold level but not a second threshold level higher than the first threshold level, and each bit being in a second state when said rectified response does not exceed said first threshold level or exceeds both said first and said second threshold levels.

38. The digital signal receiver as set forth in claim 31, wherein said highpass digital frame-comb filter succeeds said highpass digital line-comb filter in their said cascade connection and comprises:

an input connection of said highpass digital frame-comb filter for receiving response from said highpass digital line-comb filter;

an output connection of said highpass digital frame-comb filter for supplying said combined comb filter response;

a one-frame digital delay line for delaying the response from said highpass digital line-comb filter as received at the input connection of said highpass digital frame-comb filter by a time interval equal to the duration of a frame scan of said composite video signal; and a first digital subtractor having a first input connection for receiving the delayed response from said one-frame digital delay line, having a second input connection connected without substantial delay from the input connection of said highpass digital frame-comb filter, and having an output connection for supplying differential response to signals at the first and second input connections of said first digital subtractor to the output connection of said highpass digital frame-comb filter.

39. The digital signal receiver as set forth in claim 38, wherein said one-frame delay line is a random access memory operated in a read-then-write-over mode.

40. The digital signal receiver as set forth in claim 38, wherein said highpass digital line-comb filter comprises:

an input connection of said highpass digital line-comb filter for receiving said subsampler response;

an output connection of said highpass digital line-comb filter to the input connection of said highpass digital frame-comb filter;

a 1-H digital delay line for delaying the desired detector response, as accompanied by undesired detector response, as received at the input connection of said highpass digital line-comb filter by a time interval equal to the duration of a horizontal scan line of said composite video signal; and a second digital subtractor having a first input connection for receiving the delayed response from said 1-H digital delay line, having a second input connection connected without substantial delay from the input connection of said highpass digital line-comb filter, and having an output connection for supplying differential response to signals at the first and second input connections of said second digital subtractor to the output connection of said highpass digital line-comb filter.

41. The digital signal receiver as set forth in claim 40, wherein said symbol decision circuitry comprises:

an absolute-value circuit having an input connection for receiving said combined comb filter response and having an output connection for supplying a rectified response; and a threshold detector having an input connection for receiving said rectified response from the output connection of said absolute-value circuit and having an output connection for supplying bits of a digital signal, each bit being in a first state when said rectified response exceeds a threshold level and being in a second state when said rectified response does not exceed said threshold level.

42. The digital signal receiver as set forth in claim 38, wherein said highpass digital line-comb filter comprises:

an input connection of said highpass digital line-comb filter for receiving said subsampler response;

an output connection of said highpass digital line-comb filter to the input connection of said highpass digital frame-comb filter;

a first 1-H digital delay line for delaying the desired detector response, as accompanied by undesired detector response, as received at the input connection of said highpass digital line-comb filter by a time interval equal to the duration 1-H of a horizontal scan line of said composite video signal;

a second digital subtractor having a first input connection for receiving the delayed response from said first 1-H digital delay line, having a second input connection connected without substantial delay from the input connection of said highpass digital line-comb filter, and having an output connection for supplying differential response to signals at the first and second input connections of said second digital subtractor;

a second 1-H digital delay line for delaying the differential response of said second digital subtractor by a time interval equal to the duration 1-H; and a third digital subtractor having a first input connection for receiving the delayed response from said second 1-H digital delay line, having a second input connection connected without substantial delay from the output connection of said second digital subtractor, and having an output connection for supplying differential response to signals at the first and second input connections of said third digital subtractor to the output connection of said highpass digital line-comb filter.

43. The digital signal receiver as set forth in claim 42, wherein said symbol decision circuitry comprises:

an absolute-value circuit having an input connection for receiving said combined comb filter response and having an output connection for supplying a rectified response; and a dual-threshold detector having an input connection for receiving said rectified response from the output connection of said absolute-value circuit and having an output connection for supplying bits of a digital signal, each bit being in a first state when said rectified response exceeds a first threshold level but not a second threshold level higher than the first threshold level, and each bit being in a second state when said rectified response does not exceed said first threshold level or exceeds both said first and said second threshold levels.

44. A digital signal receiver for use with a system which in a combined transmission with a video carrier wave the amplitude of which is modulated in accordance with a composite video signal serially transmits digital symbols in binary phase-shift keying modulation sidebands of a suppressed carrier wave in quadrature phasing with said video carrier wave, said digital signal receiver comprising:

detection apparatus for responding to said combined transmission to supply an analog detector response, detecting the binary phase-shift keying of said suppressed carrier wave thereby to generate a desired detector response, as accompanied by undesired detector response composed of remnants of the composite video signal detected from the amplitude-modulated video carrier wave;

a sigma-delta analog-to-digital converter for converting said analog detector response to a digitized detector response;

a cascade connection of a highpass digital line-comb filter and a highpass digital frame-comb filter, responding to said digitized detector response with a combined comb filter response, each sample of said combined comb filter response having one or more possible levels of response greater than the levels in each digital symbol included in said digitized detector response; and symbol decision circuitry responsive to said combined comb filter response for deciding the identity of each digital symbol to generate a bit-serial digital signal response.

45. The digital signal receiver as set forth in claim 44, wherein said highpass digital frame-comb filter precedes said highpass digital line-comb filter in their said cascade connection and comprises:

an input connection of said highpass digital frame-comb filter for receiving said digitized detector response;

an output connection of said highpass digital frame-comb filter for supplying highpass digital frame-comb filter response to said highpass digital line-comb filter as its input signal;

a one-frame digital delay line for delaying said digitized detector response as received at the input connection of said highpass digital frame-comb filter by a time interval equal to the duration of a frame scan of said composite video signal; and a first digital subtractor having a first input connection for receiving the delayed response from said one-frame digital delay line, having a second input connection connected without substantial delay from the input connection of said highpass digital frame-comb filter, and having an output connection for supplying differential response to signals at the first and second input connections of said first digital subtractor to the output connection of said highpass digital frame-comb filter.

46. The digital signal receiver as set forth in claim 45, wherein said one-frame delay line is a random access memory operated in a read-then-write-over mode.

47. The digital signal receiver as set forth in claim 45, wherein said highpass digital line-comb filter comprises:

an input connection of said highpass digital line-comb filter for receiving said highpass digital frame-comb filter response;

an output connection of said highpass digital line-comb filter for supplying said combined comb filter response;

a 1-H digital delay line for delaying said highpass digital frame-comb filter response, as received at the input connection of said highpass digital line-comb filter by a time interval equal to the duration of a horizontal scan line of said composite video signal; and a second digital subtractor having a first input connection for receiving the delayed response from said 1-H digital delay line, having a second input connection connected without substantial delay from the input connection of said highpass digital line-comb filter, and having an output connection for supplying differential response to signals at the first and second input connections of said second digital subtractor to the output connection of said highpass digital line-comb filter.

48. The digital signal receiver as set forth in claim 47, wherein said symbol decision circuitry comprises:

an absolute-value circuit having an input connection for receiving said combined comb filter response and having an output connection for supplying a rectified response; and a threshold detector having an input connection for receiving said rectified response from the output connection of said absolute-value circuit and having an output connection for supplying bits of a digital signal, each bit being in a first state when said rectified response exceeds a threshold level and being in a second state when said rectified response does not exceed said threshold level.

49. The digital signal receiver as set forth in claim 45, wherein said highpass digital line-comb filter comprises:

an input connection of said highpass digital line-comb filter for receiving said highpass digital frame-comb filter response;

an output connection of said highpass digital line-comb filter for supplying said combined comb filter response;

a first 1-H digital delay line for delaying said highpass digital frame-comb filter response, as received at the input connection of said highpass digital line-comb filter by a time interval equal to the duration of a horizontal scan line of said composite video signal;

a second digital subtractor having a first input connection for receiving the delayed response from said first 1-H digital delay line, having a second input connection connected without substantial delay from the input connection of said highpass digital line-comb filter, and having an output connection for supplying differential response to signals at the first and second input connections of said second digital subtractor;

a second 1-H digital delay line for delaying the differential response of said second digital subtractor by a time interval equal to the duration 1-H; and a third digital subtractor having a first input connection for receiving the delayed response from said second 1-H digital delay line, having a second input connection connected without substantial delay from the output connection of said third digital subtractor, and having an output connection for supplying differential response to signals at the first and second input connections of said third digital subtractor to the output connection of said highpass digital line-comb filter.

50. The digital signal receiver as set forth in claim 49, wherein said symbol decision circuitry comprises:

an absolute-value circuit having an input connection for receiving said combined comb filter response and having an output connection for supplying a rectified response; and a dual-threshold detector having an input connection for receiving said rectified response from the output connection of said absolute-value circuit and having an output connection for supplying bits of a digital signal, each bit being in a first state when said rectified response exceeds a first threshold level but not a second threshold level higher than the first threshold level, and each bit being in a second state when said rectified response does not exceed said first threshold level or exceeds both said first and said second threshold levels.

51. The digital signal receiver as set forth in claim 44, wherein said highpass digital frame-comb filter succeeds said highpass digital line-comb filter in their said cascade connection and comprises:

an input connection of said highpass digital frame-comb filter for receiving response from said highpass digital line-comb filter;

an output connection of said highpass digital frame-comb filter for supplying said combined comb filter response;

a one-frame digital delay line for delaying the response from said highpass digital line-comb filter as received at the input connection of said highpass digital frame-comb filter by a time interval equal to the duration of a frame scan of said composite video signal; and a first digital subtractor having a first input connection for receiving the delayed response from said one-frame digital delay line, having a second input connection connected without substantial delay from the input connection of said highpass digital frame-comb filter, and having an output connection for supplying differential response to signals at the first and second input connections of said first digital subtractor to the output connection of said highpass digital frame-comb filter.

52. The digital signal receiver as set forth in claim 51, wherein said one-frame delay line is a random access memory operated in a read-then-write-over mode.

53. The digital signal receiver as set forth in claim 51, wherein said highpass digital line-comb filter comprises:

an input connection of said highpass digital line-comb filter for receiving said digitized detector response;

an output connection of said highpass digital line-comb filter to the input connection of said highpass digital frame-comb filter;

a 1-H digital delay line for delaying the desired detector response, as accompanied by undesired detector response, as received at the input connection of said highpass digital line-comb filter by a time interval equal to the duration of a horizontal scan line of said composite video signal; and a second digital subtractor having a first input connection for receiving the delayed response from said 1-H digital delay line, having a second input connection connected without substantial delay from the input connection of said highpass digital line-comb filter, and having an output connection for supplying differential response to signals at the first and second input connections of said second digital subtractor to the output connection of said highpass digital line-comb filter.

54. The digital signal receiver as set forth in claim 53, wherein said symbol decision circuitry comprises:

an absolute-value circuit having an input connection for receiving said combined comb filter response and having an output connection for supplying a rectified response; and a threshold detector having an input connection for receiving said rectified response from the output connection of said absolute-value circuit and having an output connection for supplying bits of a digital signal, each bit being in a first state when said rectified response exceeds a threshold level and being in a second state when said rectified response does not exceed said threshold level.

55. The digital signal receiver as set forth in claim 51, wherein said highpass digital line-comb filter comprises:

an input connection of said highpass digital line-comb filter for receiving said subsampler response;

an output connection of said highpass digital line-comb filter to the input connection of said highpass digital frame-comb filter;

a first 1-H digital delay line for delaying the desired detector response, as accompanied by undesired detector response, as received at the input connection of said highpass digital line-comb filter by a time interval equal to the duration 1-H of a horizontal scan line of said composite video signal;

a second digital subtractor having a first input connection for receiving the delayed response from said first 1-H digital delay line, having a second input connection connected without substantial delay from the input connection of said highpass digital line-comb filter, and having an output connection for supplying differential response to signals at the first and second input connections of said second digital subtractor;

a second 1-H digital delay line for delaying the differential response of said second digital subtractor by a time interval equal to the duration 1-H; and a third digital subtractor having a first input connection for receiving the delayed response from said second 1-H digital delay line, having a second input connection connected without substantial delay from the output connection of said second digital subtractor, and having an output connection for supplying differential response to signals at the first and second input connections of said third digital subtractor to the output connection of said highpass digital line-comb filter.

56. The digital signal receiver as set forth in claim 55, wherein said symbol decision circuitry comprises:

an absolute-value circuit having an input connection for receiving said combined comb filter response and having an output connection for supplying a rectified response; and a dual-threshold detector having an input connection for receiving said rectified response from the output connection of said absolute-value circuit and having an output connection for supplying bits of a digital signal, each bit being in a first state when said rectified response exceeds a first threshold level but not a second threshold level higher than the first threshold level, and each bit being in a second state when said rectified response does not exceed said first threshold level or exceeds both said first and said second threshold levels.

57. A digital signal receiver for use with a system for transmitting digital information in binary phase-shift keying modulation sidebands of a suppressed carrier wave, which said suppressed carrier wave is in quadrature phasing with a video carrier wave the amplitude of which said video carrier wave is modulated in accordance with a composite video signal, said digital signal receiver comprising:

a tuner for supplying intermediate-frequency signal response to a selected radio-frequency signal comprising an amplitude-modulated video carrier wave and binary phase-shift-keyed suppressed carrier wave;

an intermediate-frequency amplifier for said intermediate-frequency signal response, said intermediate-frequency amplifier including filtering and amplifying elements and supplying an amplified intermediate-frequency amplifier response;

first controlled oscillator circuitry for generating in-phase and quadrature-phase intermediate-frequency video carrier waves, at an intermediate frequency and average phase which are controlled by a frequency and phase error signal;

an in-phase video detector receptive of said amplified intermediate-frequency amplifier response for synchronously detecting a composite video signal from said amplified intermediate-frequency amplifier response, in accordance with said in-phase intermediate-frequency video carrier wave supplied thereto;

a quadrature-phase video detector receptive of said amplified intermediate-frequency amplifier response for synchronously detecting a binary phase-shift-keying signal from said amplified intermediate-frequency amplifier response, in accordance with said quadrature-phase intermediate-frequency video carrier wave supplied thereto, which binary phase-shift-keying signal is accompanied, in quadrature-phase video detector response from said quadrature-phase video detector, by portions of said composite video signal including said frequency and phase error signal;

a horizontal sync separator for separating horizontal synchronizing pulses from the composite video signal detected by said in-phase video detector;

second controlled oscillator circuitry for generating clocking oscillations at a frequency and phase controlled by said separated horizontal synchronizing pulses, said frequency being a multiple of symbol rate for said binary phase-shift-keying signal;

an analog-to-digital converter having an input connection for receiving said quadrature-phase video detector response and having an output connection for supplying digitized response to samples of said quadrature-phase video detector response, as sampled responsive to said clocking oscillations;

means for supplying digitized quadrature-phase video detector response at said symbol rate for said binary phase-shift-keying signal, responsive to digitized response from the output connection of said analog-to-digital converter to samples of said analog input signal, as sampled responsive to said clocking oscillations;

a digital comb filter, receiving said digitized quadrature-phase video detector response supplied at said symbol rate for said binary phase-shift-keying signal, and supplying a digital comb filter response to said binary phase-shift-keying signal therein, in which digital comb filter response to said accompanying portions of said composite video signal is suppressed; and symbol decision circuitry for receiving said digital comb filter response and deciding upon the symbols transmitted by said binary phase-shift-keying signal.

58. The digital signal receiver as set forth in claim 57, wherein said clocking oscillations are of a frequency such that said analog-to-digital converter oversamples said detector response and digitizes the resulting samples to generate an oversampled digitized detector response having a given number of bits resolution for each of the resulting samples so digitized, and wherein said means for supplying digitized quadrature-phase video detector response at said symbol rate for said binary phase-shift-keying signal comprises:

a digital lowpass filter receiving said oversampled digitized detector response from said analog-to-digital converter and generating a digital lowpass filter response; and a subsampler for decimating said digital lowpass filter response, thereby to generate said digitized quadrature-phase video detector response at said symbol rate for said binary phase-shift-keying signal.

59. The digital signal receiver as set forth in claim 57, wherein said digital comb filter comprises a cascade connection of a highpass digital frame-comb filter followed by a highpass digital line-comb filter.

60. The digital signal receiver as set forth in claim 59, wherein said highpass digital frame-comb filter comprises:

an input connection of said highpass digital frame-comb filter for receiving said subsampler response;

an output connection of said highpass digital frame-comb filter for supplying highpass digital frame-comb filter response to said highpass digital line-comb filter as its input signal;

a one-frame digital delay line for delaying said subsampler response as received at the input connection of said highpass digital frame-comb filter by a time interval equal to the duration of a frame scan of said composite video signal; and a first digital subtractor having a first input connection for receiving the delayed response from said one-frame digital delay line, having a second input connection connected without substantial delay from the input connection of said highpass digital frame-comb filter, and having an output connection for supplying differential response to signals at the first and second input connections of said first digital subtractor to the output connection of said highpass digital frame-comb filter.

61. The digital signal receiver as set forth in claim 60, wherein said highpass digital line-comb filter comprises:

an input connection of said highpass digital line-comb filter for receiving said highpass digital frame-comb filter response;

an output connection of said highpass digital line-comb filter for supplying said combined comb filter response;

a 1-H digital delay line for delaying said highpass digital frame-comb filter response, as received at the input connection of said highpass digital line-comb filter by a time interval equal to the duration of a horizontal scan line of said composite video signal; and a second digital subtractor having a first input connection for receiving the delayed response from said 1-H digital delay line, having a second input connection connected without substantial delay from the input connection of said highpass digital line-comb filter, and having an output connection for supplying differential response to signals at the first and second input connections of said second digital subtractor to the output connection of said highpass digital line-comb filter.

62. The digital signal receiver as set forth in claim 61, wherein said symbol decision circuitry comprises:

an absolute-value circuit having an input connection for receiving said combined comb filter response and having an output connection for supplying a rectified response; and a threshold detector having an input connection for receiving said rectified response from the output connection of said absolute-value circuit and having an output connection for supplying bits of a digital signal, each bit being in a first state when said rectified response exceeds a threshold level and being in a second state when said rectified response does not exceed said threshold level.

63. The digital signal receiver as set forth in claim 61, wherein the output signal bits supplied from the output connection of said symbol-decision circuitry are supplied at symbol rate, said digital signal receiver further comprising:

a vertical sync separator for separating vertical synchronizing pulses from the composite video signal detected by said in-phase video detector;

a data frame counter for counting separated vertical synchronizing pulses that occur when symbol-per-row count is not in the mid-row region, thereby to generate a data frame count; and a rate buffer having an input connection connected for receiving bits from the output connection of said symbol-decision circuitry, receiving said bits when and only when said data frame count modulo-2 has a prescribed one of two values, and having an output connection for supplying said symbol-decision circuitry output signal bits at one-half symbol rate and in a prescribed order.

64. The digital signal receiver as set forth in claim 63, wherein said rate buffer is operated as a de-interleaver for supplying said symbol-decision circuitry output signal bits at one-half symbol rate and in data-column-by-data-column order, said digital signal receiver further comprising:

an error-correction decoder for generating a stream of error-corrected bits in response to said symbol-decision circuitry output signal bits supplied from said rate buffer.

65. The digital signal receiver as set forth in claim 63, further comprising:

a symbol-per-row counter for counting said symbol clocking oscillations, thereby to generate a symbol-per-row count, said symbol-per-row counter responding to each said separated horizontal synchronizing pulse to reset said symbol count to a prescribed base count value for said symbol count;

a data row counter for counting each time said symbol-per-row counter is reset, thereby to generate a data row count, said data row counter responding to each said separated vertical synchronizing pulse to reset said data row count to a prescribed base count value for said data row count; and at least one random access memory included in said rate buffer, written at individual times by bits from the output connection of said symbol-decision circuitry when and only when said data frame count modulo-2 has said prescribed one of two values, and receiving said data row count and symbol-per-row count together as write addressing during said individual times.

66. The digital signal receiver as set forth in claim 60, wherein said highpass digital line-comb filter comprises:

an input connection of said highpass digital line-comb filter for receiving said highpass digital frame-comb filter response;

an output connection of said highpass digital line-comb filter for supplying said combined comb filter response;

a first 1-H digital delay line for delaying said highpass digital frame-comb filter response, as received at the input connection of said highpass digital line-comb filter by a time interval equal to the duration of a horizontal scan line of said composite video signal;

a second digital subtractor having a first input connection for receiving the delayed response from said first 1-H digital delay line, having a second input connection connected without substantial delay from the input connection of said highpass digital line-comb filter, and having an output connection for supplying differential response to signals at the first and second input connections of said second digital subtractor;

a second 1-H digital delay line for delaying the differential response of said second digital subtractor by a time interval equal to the duration 1-H; and a third digital subtractor having a first input connection for receiving the delayed response from said second 1-H digital delay line, having a second input connection connected without substantial delay from the output connection of said third digital subtractor, and having an output connection for supplying differential response to signals at the first and second input connections of said third digital subtractor to the output connection of said highpass digital line-comb filter.

67. The digital signal receiver as set forth in claim 66, wherein said symbol decision circuitry comprises:

an absolute-value circuit having an input connection for receiving; said combined comb filter response and having an output connection for supplying a rectified response; and a dual-threshold detector having an input connection for receiving said rectified response from the output connection of said absolute-value circuit and having an output connection for supplying bits of a digital signal, each bit being in a first state when said rectified response exceeds a first threshold level but not a second threshold level higher than the first threshold level, and each bit being in a second state when said rectified response does not exceed said first threshold level or exceeds both said first and said second threshold levels.

68. The digital signal receiver as set forth in claim 66, wherein the output signal bits supplied from the output connection of said symbol-decision circuitry are supplied at symbol rate, said digital signal receiver further comprising:

a vertical sync separator for separating vertical synchronizing pulses from the composite video signal detected by said in-phase video detector;

a data frame counter for counting separated vertical synchronizing pulses that occur when symbol-per-row count is not in the mid-row region, thereby to generate a data frame count; and a rate buffer having an input connection connected for receiving bits from the output connection of said symbol-decision circuitry, receiving said bits when and only when said data frame count modulo-2 has a prescribed one of two values, and having an output connection for supplying said symbol-decision circuitry output signal bits at one-half symbol rate and in a prescribed order.

69. The digital signal receiver as set forth in claim 68, wherein said rate buffer is operated as a de-interleaver for supplying said symbol-decision circuitry output signal bits at one-half symbol rate and in data-column-by-data-column order, said digital signal receiver further comprising:

an error-correction decoder for generating a stream of error-corrected bits in response to said symbol-decision circuitry output signal bits supplied from said rate buffer.

70. The digital signal receiver as set forth in claim 68, further comprising:

a symbol-per-row counter for counting said symbol clocking oscillations, thereby to generate a symbol-per-row count, said symbol-per-row counter responding to each said separated horizontal synchronizing pulse to reset said symbol count to a prescribed base count value for said symbol count;

a data row counter for counting each time said symbol-per-row counter is reset, thereby to generate a data row count, said data row counter responding to each said separated vertical synchronizing pulse to reset said data row count to a prescribed base count value for said data row count; and at least one random access memory included in said rate buffer, written at individual times by bits from the output connection of said symbol-decision circuitry when and only when said data frame count modulo-2 has said prescribed one of two values, and receiving said data row count and symbol-per-row count together as write addressing during said individual times.

71. The digital signal receiver as set forth in claim 57, wherein said digital comb filter comprises a cascade connection of a highpass digital line-comb filter followed by a highpass digital frame-comb filter.

72. The digital signal receiver as set forth in claim 71, wherein said highpass digital frame-comb filter comprises:

an input connection of said highpass digital frame-comb filter for receiving response from said highpass digital line-comb filter;

an output connection of said highpass digital frame-comb filter for supplying said combined comb filter response;

a one-frame digital delay line for delaying the response from said highpass digital line-comb filter as received at the input connection of said highpass digital frame-comb filter by a time interval equal to the duration of a frame scan of said composite video signal; and a first digital subtractor having a first input connection for receiving the delayed response from said one-frame digital delay line, having a second input connection connected without substantial delay from the input connection of said highpass digital frame-comb filter, and having an output connection for supplying differential response to signals at the first and second input connections of said first digital subtractor to the output connection of said highpass digital frame-comb filter.

73. The digital signal receiver as set forth in claim 72, wherein said highpass digital line-comb filter comprises:

an input connection of said highpass digital line-comb filter for receiving said subsampler response;

an output connection of said highpass digital line-comb filter to the input connection of said highpass digital frame-comb filter;

a 1-H digital delay line for delaying the desired detector response, as accompanied by undesired detector response, as received at the input connection of said highpass digital line-comb filter by a time interval equal to the duration of a horizontal scan line of said composite video signal; and a second digital subtractor having a first input connection for receiving the delayed response from said 1-H digital delay line, having a second input connection connected without substantial delay from the input connection of said highpass digital line-comb filter, and having an output connection for supplying differential response to signals at the first and second input connections of said second digital subtractor to the output connection of said highpass digital line-comb filter.

74. The digital signal receiver as set forth in claim 73, wherein said symbol decision circuitry comprises:

an absolute-value circuit having an input connection for receiving said combined comb filter response and having an output connection for supplying a rectified response; and a threshold detector having an input connection for receiving said rectified response from the output connection of said absolute-value circuit and having an output connection for supplying bits of a digital signal, each bit being in a first state when said rectified response exceeds a threshold level and being in a second state when said rectified response does not exceed said threshold level.

75. The digital signal receiver as set forth in claim 73, wherein the output signal bits supplied from the output connection of said symbol-decision circuitry are supplied at symbol rate, said digital signal receiver further comprising:

a vertical sync separator for separating vertical synchronizing pulses from the composite video signal detected by said in-phase video detector;

a data frame counter for counting separated vertical synchronizing pulses that occur when symbol-per-row count is not in the mid-row region, thereby to generate a data frame count; and a rate buffer having an input connection connected for receiving bits from the output connection of said symbol-decision circuitry, receiving said bits when and only when said data frame count modulo-2 has a prescribed one of two values, and having an output connection for supplying said symbol-decision circuitry output signal bits at one-half symbol rate and in a prescribed order.

76. The digital signal receiver as set forth in claim 75, wherein said rate buffer is operated as a de-interleaver for supplying said symbol-decision circuitry output signal bits at one-half symbol rate and in data-column-by-data-column order, said digital signal receiver further comprising:

an error-correction decoder for generating a stream of error-corrected bits in response to said symbol-decision circuitry output signal bits supplied from said rate buffer.

77. The digital signal receiver as set forth in claim 75, further comprising:

a symbol-per-row counter for counting said symbol clocking oscillations, thereby to generate a symbol-per-row count, said symbol-per-row counter responding to each said separated horizontal synchronizing pulse to reset said symbol count to a prescribed base count value for said symbol count;

a data row counter for counting each time said symbol-per-row counter is reset, thereby to generate a data row count, said data row counter responding to each said separated vertical synchronizing pulse to reset said data row count to a prescribed base count value for said data row count; and at least one random access memory included in said rate buffer, written at individual times by bits from the output connection of said symbol-decision circuitry when and only when said data frame count modulo-2 has said prescribed one of two values, and receiving said data row count and symbol-per-row count together as write addressing during said individual times.

78. The digital signal receiver as set forth in claim 72, wherein said highpass digital line-comb filter comprises:

an input connection of said highpass digital line-comb filter for receiving said subsampler response;

an output connection of said highpass digital line-comb filter to the input connection of said highpass digital frame-comb filter;

a first 1-H digital delay line for delaying the desired detector response, as accompanied by undesired detector response, as received at the input connection of said highpass digital line-comb filter by a time interval equal to the duration 1-H of a horizontal scan line of said composite video signal;

a second digital subtractor having a first input connection for receiving the delayed response from said first 1-H digital delay line, having a second input connection connected without substantial delay from the input connection of said highpass digital line-comb filter, and having an output connection for supplying differential response to signals at the first and second input connections of said second digital subtractor;

a second 1-H digital delay line for delaying the differential response, of said second digital subtractor by a time interval equal to the duration 1-H; and a third digital subtractor having a first input connection for receiving the delayed response from said second 1-H digital delay line, having a second input connection connected without substantial delay from the output connection of said second digital subtractor, and having an output connection for supplying differential response to signals at the first and second input connections of said third digital subtractor to the output connection of said highpass digital line-comb filter.

79. The digital signal receiver as set forth in claim 78, wherein said symbol decision circuitry comprises:

an absolute-value circuit having an input connection for receiving said combined comb filter response and having an output connection for supplying a rectified response; and a dual-threshold detector having an input connection for receiving said rectified response from the output connection of said absolute-value circuit and having an output connection for supplying bits of a digital signal, each bit being in a first state when said rectified response exceeds a first threshold level but not a second threshold level higher than the first threshold level, and each bit being in a second state when said rectified response does not exceed said first threshold level or exceeds both said first and said second threshold levels.

80. The digital signal receiver as set forth in claim 78, wherein the output signal bits supplied from the output connection of said symbol-decision circuitry are supplied at symbol rate, said digital signal receiver further comprising:

a vertical sync separator for separating vertical synchronizing pulses from the composite video signal detected by said in-phase video detector;

a data frame counter for counting separated vertical synchronizing pulses that occur when symbol-per-row count is not in the mid-row region, thereby to generate a data frame count; and a rate buffer having an input connection connected for receiving bits from the output connection of said symbol-decision circuitry, receiving said bits when and only when said data frame count modulo-2 has a prescribed one of two values, and having an output connection for supplying said symbol-decision circuitry output signal bits at one-half symbol rate and in a prescribed order.

81. The digital signal receiver as set forth in claim 80, wherein said rate buffer is operated as a de-interleaver for supplying said symbol-decision circuitry output signal bits at one-half symbol rate and in data, column-by-data-column order, said digital signal receiver further comprising:

an error-correction decoder for generating a stream of error-corrected bits in response to said symbol-decision circuitry output signal bits supplied from said rate buffer.

82. The digital signal receiver as set forth in claim 80, further comprising:

a symbol-per-row counter for counting said symbol clocking oscillations, thereby to generate a symbol-per-row count; said symbol-per-row counter responding to each said separated horizontal synchronizing pulse to reset said symbol count to a prescribed base count value for said symbol count;

a data row counter for counting each time said symbol-per-row counter is reset, thereby to generate a data row count, said data row counter responding to each said separated vertical synchronizing pulse to reset said data row count to a prescribed base count value for said data row count; and at least one random access memory included in said rate buffer, written at individual times by bits from the output connection of said symbol-decision circuitry when and only when said data frame count modulo-2 has said prescribed one of two values, and receiving said data row count and symbol-per-row count together as write addressing during said individual times.

83. A digital signal receiver for use with a system for transmitting digital information in binary phase-shift keying modulation sidebands of a suppressed carrier wave, which said suppressed carrier wave is in quadrature phasing with a video carrier wave the amplitude of which said video carrier wave is modulated in accordance with a composite video signal, said digital signal receiver comprising:

a tuner for supplying intermediate-frequency signal response to a selected radio-frequency signal comprising an amplitude-modulated video carrier wave and binary phase-shift-keyed suppressed carrier wave;

an intermediate-frequency amplifier for said intermediate-frequency signal response, said intermediate-frequency amplifier including filtering and amplifying elements and supplying an amplified intermediate-frequency amplifier response;

first controlled oscillator circuitry for generating in-phase and quadrature-phase intermediate-frequency video carrier waves, at an intermediate frequency and average phase which are controlled by a frequency and phase error signal;

an in-phase video detector receptive of said amplified intermediate-frequency amplifier response for synchronously detecting a composite video signal from said amplified intermediate-frequency amplifier response, in accordance with said in-phase intermediate-frequency video carrier wave supplied thereto;

a quadrature-phase video detector receptive of said amplified intermediate-frequency amplifier response for synchronously detecting a binary phase-shift-keying signal from said amplified intermediate-frequency amplifier response, in accordance with said quadrature-phase intermediate-frequency video carrier wave supplied thereto, which binary phase-shift-keying signal is accompanied, in quadrature-phase video detector response from said quadrature-phase video detector, by portions of said composite video signal including said frequency and phase error signal;

a horizontal sync separator for separating horizontal synchronizing pulses from the composite video signal detected by said in-phase video detector;

second controlled oscillator circuitry for generating clocking oscillations at a frequency and phase controlled by said separated horizontal synchronizing pulses, said frequency being a multiple of symbol rate for said binary phase-shift-keying signal;

a sigma-delta analog-to-digital converter having an input connection for receiving said quadrature-phase video detector response and having an output connection for supplying, at said symbol rate for said binary phase-shift-keying signal, digitized response to samples of said quadrature-phase video detector response, as sampled responsive to said clocking oscillations;

a digital comb filter, receiving said digitized quadrature-phase video detector response supplied at said symbol rate for said binary phase-shift-keying signal, and supplying a digital comb filter response to said binary phase-shift-keying signal therein, in which digital comb filter response to said accompanying portions of said composite video signal is suppressed; and symbol decision circuitry for receiving said digital comb filter response and deciding upon the symbols transmitted by said binary phase-shift-keying signal.

84. The digital signal receiver as set forth in claim 83, wherein sigma-delta analog-to-digital converter comprises:

a differential-input amplifier having a first input connection for receiving said analog detector response, having a second input connection for receiving an analog feedback signal, and having an output connection for supplying an analog error signal proportional to the difference between said detector response and said analog feedback signal;

a flash converter for converting said analog error signal to samples of a digital error signal with multiple-bit resolution;

a digital-to-analog converter receiving the most significant bit of said digital error signal as a digital feedback signal and converting it to said analog feedback signal; and means for performing weighted accumulations of said samples of a digital error signal over prescribed subsampling periods to generate samples of digitized detector response.

85. The digital signal receiver as set forth in claim 83, wherein said digital comb filter comprises a cascade connection of a highpass digital frame-comb filter followed by a highpass digital line-comb filter.

86. The digital signal receiver as set forth in claim 85, wherein said highpass digital frame-comb filter comprises:

an input connection of said highpass digital frame-comb filter for receiving at said symbol rate samples of said digitized response to samples of said quadrature-phase video detector;

an output connection of said highpass digital frame-comb filter for supplying highpass digital frame-comb filter response to said highpass digital line-comb filter as its input signal;

a one-frame digital delay line for delaying said subsampler response as received at the input connection of said highpass digital frame-comb filter by a time interval equal to the duration of a frame scan of said composite video signal; and a first digital subtractor having a first input connection for receiving the delayed response from said one-frame digital delay line, having a second input connection connected without substantial delay from the input connection of said highpass digital frame-comb filter, and having an output connection for supplying differential response to signals at the first and second input connections of said first digital subtractor to the output connection of said highpass digital frame-comb filter.

87. The digital signal receiver as set forth in claim 86, wherein said highpass digital line-comb filter comprises:
- an input connection of said highpass digital line-comb filter for receiving said highpass digital frame-comb filter response;
- an output connection of said highpass digital line-comb filter for supplying said combined comb filter response;
- a 1-H digital delay line for delaying said highpass digital frame-comb filter response, as received at the input connection of said highpass digital line-comb filter by a time interval equal to the duration of a horizontal scan line of said composite video signal; and
- a second digital subtractor having a first input connection for receiving the delayed response from said 1-H digital delay line, having a second input connection connected without substantial delay from the input connection of said highpass digital line-comb filter, and having an output connection for supplying differential response to signals at the first and second input connections of said second digital subtractor to the output connection of said highpass digital line-comb filter.

88. The digital signal receiver as set forth in claim 87, wherein said symbol decision circuitry comprises:
- an absolute-value circuit having an input connection for receiving said combined comb filter response and having an output connection for supplying a rectified response; and
- a threshold detector having an input connection for receiving said rectified response from the output connection of said absolute-value circuit and having an output connection for supplying bits of a digital signal, each bit being in a first state when said rectified response exceeds a threshold level and being in a second state when said rectified response does not exceed said threshold level.

89. The digital signal receiver as set forth in claim 87, wherein the output signal bits supplied from the output connection of said symbol-decision circuitry are supplied at symbol rate, said digital signal receiver further comprising:
- a vertical sync separator for separating vertical synchronizing pulses from the composite video signal detected by said in-phase video detector;
- a data frame counter for counting separated vertical synchronizing pulses that occur when symbol-per-row count is not in the mid-row region, thereby to generate a data frame count; and
- a rate buffer having an input connection connected for receiving bits from the output connection of said symbol-decision circuitry, receiving said bits when and only when said data frame count modulo-2 has a prescribed one of two values, and having an output connection for supplying said symbol-decision circuitry output signal bits at one-half symbol rate and in a prescribed order.

90. The digital signal receiver as set forth in claim 89, wherein said rate buffer is operated as a de-interleaver tier supplying said symbol-decision circuitry output signal bits at one-half symbol rate and in data-column-by-data-column order, said digital signal receiver further comprising:
- an error-correction decoder for generating a stream of error-corrected bits in response to said symbol-decision circuitry output signal bits supplied from said rate buffer.

91. The digital signal receiver as set forth in claim 89, further comprising:
- a symbol-per-row counter for counting said symbol clocking oscillations, thereby to generate a symbol-per-row count, said symbol-per-row counter responding to each said separated horizontal synchronizing pulse to reset said symbol count to a prescribed base count value for said symbol count;
- a data row counter for counting each time said symbol-per-row counter is reset, thereby to generate a data row count, said data row counter responding to each said separated vertical synchronizing pulse to reset said data row count to a prescribed base count value for said data row count; and
- at least one random access memory included in said rate buffer, written at individual times by bits from the output connection of said symbol-decision circuitry when and only when said data frame count modulo-2 has said prescribed one of two values, and receiving said data row count and symbol-per-row count together as write addressing during said individual times.

92. The digital signal receiver as set forth in claim 86, wherein said highpass digital line-comb filter comprises:
- an input connection of said highpass digital line-comb filter for receiving said highpass digital frame-comb filter response;
- an output connection of said highpass digital line-comb filter for supplying said combined comb filter response;
- a first 1-H digital delay line for delaying said highpass digital frame-comb filter response, as received at the input connection of said highpass digital line-comb filter by a time interval equal to the duration of a horizontal scan line of said composite video signal;
- a second digital subtractor having a first input connection for receiving the delayed response from said first 1-H digital delay line, having a second input connection connected without substantial delay from the input connection of said highpass digital line-comb filter, and having an output connection for supplying differential response to signals at the first and second input connections of said second digital subtractor;
- a second 1-H digital delay line for delaying the differential response; of said second digital subtractor by a time interval equal to the duration 1-H; and
- a third digital subtractor having a first input connection for receiving the delayed response from said second 1-H digital delay line, having a second input connection connected without substantial delay from the output connection of said third digital subtractor, and having an output connection for supplying differential response to signals at the first and second input connections of said third digital subtractor to the output connection of said highpass digital line-comb filter.

93. The digital signal receiver as set forth in claim 92, wherein said symbol decision circuitry comprises:
- an absolute-value circuit having an input connection for receiving said combined comb filter response and having an output connection for supplying a rectified response; and
- a dual-threshold detector having an input connection for receiving said rectified response from the output connection of said absolute-value circuit and having an output connection for supplying bits of a digital signal, each bit being in a first state when said rectified response exceeds a first threshold level but not a second threshold level higher than the first threshold level, and each bit being in a second state when said rectified response does not exceed said first threshold level or exceeds both said first and said second threshold levels.

94. The digital signal receiver as set forth in claim 92, wherein the output signal bits supplied from the output connection of said symbol-decision circuitry are supplied at symbol rate, said digital signal receiver further comprising:

a vertical sync separator for separating vertical synchronizing pulses from the composite video signal detected by said in-phase video detector;

a data frame counter for counting separated vertical synchronizing pulses that occur when symbol-per-row count is not in the mid-row region, thereby to generate a data frame count; and a rate buffer having an input connection connected for receiving bits from the output connection of said symbol-decision circuitry, receiving said bits when and only when said data frame count modulo-2 has a prescribed one of two values, and having an output connection for supplying said symbol-decision circuitry output signal bits at one-half symbol rate and in a prescribed order.

95. The digital signal receiver as set forth in claim 94, wherein said rate buffer is operated as a de-interleaver for supplying said symbol-decision circuitry output signal bits at one-half symbol rate and in data-column-by-data-column order, said digital signal receiver further comprising:

an error-correction decoder for generating a stream of error-corrected bits in response to said symbol-decision circuitry output signal bits supplied from said rate buffer.

96. The digital signal receiver as set forth in claim 94, further comprising:

a symbol-per-row counter for counting said symbol clocking oscillations, thereby to generate a symbol-per-row count, said symbol-per-row counter responding to each said separated horizontal synchronizing pulse to reset said symbol count to a prescribed base count value for said symbol count;

a data row counter for counting each time said symbol-per-row counter is reset, thereby to generate a data row count, said data row counter responding to each said separated vertical synchronizing pulse to reset said data row count to a prescribed base count value for said data row count; and at least one random access memory included in said rate buffer, written at individual times by bits from the output connection of said symbol-decision circuitry when and only when said data frame count modulo-2 has said prescribed one of two values, and receiving said data row count and symbol-per-row count together as write addressing during said individual times.

97. The digital signal receiver as set forth in claim 83, wherein said digital comb filter comprises a cascade connection of a highpass digital line-comb filter followed by a highpass digital frame-comb filter.

98. The digital signal receiver as set forth in claim 97, wherein said highpass digital frame-comb filter comprises:

an input connection of said highpass digital frame-comb filter for receiving response from said highpass digital line-comb filter;

an output connection of said highpass digital frame-comb filter for supplying said combined comb filter response;

a one-frame digital delay line for delaying the response from said highpass digital line-comb filter as received at the input connection of said highpass digital frame-comb filter by a time interval equal to the duration of a frame scan of said composite video signal; and a first digital subtractor having a first input connection for receiving the delayed response from said one-frame digital delay line, having a second input connection connected without substantial delay from the input connection of said highpass digital frame-comb filter, and having an output connection for supplying differential response to signals at the first and second input connections of said first digital subtractor to the output connection of said highpass digital frame-comb filter.

99. The digital signal receiver as set forth in claim 98, wherein said highpass digital line-comb filter comprises:

an input connection of said highpass digital line-comb filter for receiving at said symbol rate samples of said digitized response to samples of said quadrature-phase video detector;

an output connection of said highpass digital line-comb filter to the input connection of said highpass digital frame-comb filter;

a 1-H digital delay line for delaying the desired detector response, as accompanied by undesired detector response, as received at the input connection of said highpass digital line-comb filter by a time interval equal to the duration of a horizontal scan line of said composite video signal; and a second digital subtractor having a first input connection for receiving the delayed response from said 1-H digital delay line, having a second input connection connected without substantial delay from the input connection of said highpass digital line-comb filter, and having an output connection for supplying differential response to signals at the first and second input connections of said second digital subtractor to the output connection of said highpass digital line-comb filter.

100. The digital signal receiver as set forth in claim 99, wherein said symbol decision circuitry comprises:

an absolute-value circuit having an input connection for receiving said combined comb filter response and having an output connection for supplying a rectified response; and a threshold detector having an input connection for receiving said rectified response from the output connection of said absolute-value circuit and having an output connection for supplying bits of a digital signal, each bit being in a first state when said rectified response exceeds a threshold level and being in a second state when said rectified response does not exceed said threshold level.

101. The digital signal receiver as set forth in claim 99, wherein the output signal bits supplied from the output connection of said symbol-decision circuitry are supplied at symbol rate, said digital signal receiver further comprising:

a vertical sync separator for separating vertical synchronizing pulses from the composite video signal detected by said in-phase video detector;

a data frame counter for counting separated vertical synchronizing pulses that occur when symbol-per-row count is not in the mid-row region, thereby to generate a data frame count; and a rate buffer having an input connection connected for receiving bits from the output connection of said symbol-decision circuitry, receiving said bits when and only when said data frame count modulo-2 has a prescribed one of two values, and having an output connection for supplying said symbol-decision circuitry output signal bits at one-half symbol rate and in a prescribed order.

102. The digital signal receiver as set forth in claim 101, wherein said rate buffer is operated as a de-interleaver for supplying said symbol-decision circuitry output signal bits at one-half symbol rate and in data-column-by-data-column order, said digital signal receiver further comprising;

an error-correction decoder for generating a stream of error-corrected bits in response to said symbol-decision circuitry bits supplied from said rate buffer.

103. The digital signal receiver as set forth in claim 101, further comprising:

a symbol-per-row counter for counting said symbol clocking oscillations, thereby to generate a symbol-per-row count, said symbol-per-row counter responding to each said separated horizontal synchronizing pulse to reset said symbol count to a prescribed base count value for said symbol count;

a data row counter for counting each time said symbol-per-row counter is reset, thereby to generate a data row count, said data row counter responding to each said separated vertical synchronizing pulse to reset said data row count to a prescribed base count value for said data row count; and at least one random access memory included in said rate buffer, written at individual times by bits from the output connection of said symbol-decision circuitry when and only when said data frame count modulo-2 has said prescribed one of two values, and receiving said data row count and symbol-per-row count together as write addressing during said individual times.

104. The digital signal receiver as set forth in claim 98, wherein said highpass digital line-comb filter comprises:

an input connection of said highpass digital line-comb filter for receiving at said symbol rate samples said digitized response to samples of said quadrature-phase video detector;

an output connection of said highpass digital line-comb filter to the input connection of said highpass digital frame-comb filter;

a first 1-H digital delay line for delaying the desired detector response, as accompanied by undesired detector response, as received at the input connection of said highpass digital line-comb filter by a time interval equal to the duration 1-H of a horizontal scan line of said composite video signal;

a second digital subtractor having a first input connection for receiving the delayed response from said first 1-H digital delay line, having a second input connection connected without substantial delay from the input connection of said highpass digital line-comb filter, and having an output connection for supplying differential response to signals at the first and second input connections of said second digital subtractor;

a second 1-H digital delay line for delaying the differential response of said second digital subtractor by a time interval equal to the duration 1-H; and a third digital subtractor having a first input connection for receiving the delayed response from said second 1-H digital delay line, having a second input connection connected without substantial delay from the output connection of said second digital subtractor, and having an output connection for supplying differential response to signals at the first and second input connections of said third digital subtractor to the output connection of said highpass digital line-comb filter.

105. The digital signal receiver as set forth in claim 104, wherein said symbol decision circuitry comprises:

an absolute-value circuit having an input connection for receiving said combined comb filter response and having an output connection for supplying a rectified response; and a dual-threshold detector having an input connection for receiving said rectified response from the output connection of said absolute-value circuit and having an output connection for supplying bits of a digital signal, each bit being in a first state when said rectified response exceeds a first threshold level but not a second threshold level higher than the first threshold level, and each bit being in a second state when said rectified response does not exceed said first threshold level or exceeds both said first and said second threshold levels.

106. The digital signal receiver as set forth in claim 104, wherein the output signal bits supplied from the output connection of said symbol-decision circuitry are supplied at symbol rate, said digital signal receiver further comprising:

a vertical sync separator for separating vertical synchronizing pulses from the composite video signal detected by said in-phase video detector;

a data frame counter for counting separated vertical synchronizing pulses that occur when symbol-per-row count is not in the mid-row region, thereby to generate a data frame count; and a rate buffer having an input connection connected for receiving bits from the output connection of said symbol-decision circuitry, receiving said bits when and only when said data frame count modulo-2 has a prescribed one of two values, and having an output connection for supplying said symbol-decision circuitry output signal bits at one-half symbol rate and in a prescribed order.

107. The digital signal receiver as set forth in claim 106, wherein said rate buffer is operated as a de-interleaver for supplying said symbol-decision circuitry output signal bits at one-half symbol rate and in data-column-by-data-column order, said digital signal receiver further comprising:

an error-correction decoder for generating a stream of error-corrected bits in response to said symbol-decision circuitry output signal bits supplied from said rate buffer.

108. The digital signal receiver as set forth in claim 106, further comprising:

a symbol-per-row counter for counting said symbol clocking oscillations, thereby to generate a symbol-per-row count, said symbol-per-row counter responding to each said separated horizontal synchronizing pulse to reset said symbol count to a prescribed base count value for said symbol count;

a data row counter for counting each time said symbol-per-row counter is reset, thereby to generate a data row count, said data row counter responding to each said separated vertical synchronizing pulse to reset said data row count to a prescribed base count value for said data row count; and at least one random access memory included in said rate buffer, written at individual times by bits from the output connection of said symbol-decision circuitry when and only when said data frame count modulo-2 has said prescribed one of two values, and receiving said data row count and symbol-per-row count together as write addressing during said individual times.

\* \* \* \* \*